United States Patent [19]
Konishi

[11] Patent Number: 6,104,682
[45] Date of Patent: Aug. 15, 2000

[54] DISK APPARATUS HAVING A DATA REPRODUCING SYSTEM USING A DIGITAL PLL

[75] Inventor: Shinichi Konishi, Nara, Japan

[73] Assignee: Matsushita Electric Industrial Co., Ltd., Osaka-fu, Japan

[21] Appl. No.: 09/359,726

[22] Filed: Jul. 23, 1999

[30] Foreign Application Priority Data

Jul. 23, 1998 [JP] Japan .................................. 10-207428

[51] Int. Cl.[7] ...................................................... G11B 7/00
[52] U.S. Cl. ..................... 369/44.34; 369/59; 369/275.3; 369/44.13; 369/124.01; 369/124.14
[58] Field of Search ............................... 369/47, 48, 59, 369/44.13, 124, 44.34, 275.3, 124.14, 124.1

[56] References Cited

U.S. PATENT DOCUMENTS

| | | | |
|---|---|---|---|
| 5,416,759 | 5/1995 | Chun | 369/44.34 |
| 5,442,607 | 8/1995 | Suzuki | 369/44.34 |
| 5,715,217 | 2/1998 | Fuji | 369/4.34 |
| 5,796,687 | 8/1998 | Baba | 369/44.34 |
| 5,835,467 | 11/1998 | Tomita et al. | 369/44.34 |

FOREIGN PATENT DOCUMENTS 10-27435  1/1998  Japan .

*Primary Examiner*—Nabil Hindi
*Attorney, Agent, or Firm*—Wenderoth, Lind & Ponack, L.L.P.

[57] ABSTRACT

A first D/A converter having a fine frequency resolution and second D/A converter having a rough frequency resolution are used in combination for frequency control and phase control, and a wide operational frequency range in reproduction can be covered with high accuracy by incorporating a digital PLL circuit. The dynamic ranges of the first and second D/A converters are so controlled as to be subject to addition and subtraction at a time having no problem for data reproduction. Therefore, the frequency adjustment can be rapidly performed in the frequency control and the clock continuously locked to the data can be obtained by the phase control, thereby remarkably reducing the seek time.

28 Claims, 16 Drawing Sheets

*Fig.7A*
FREQ. FINE ADJUST "OK"
*Fig.7B*
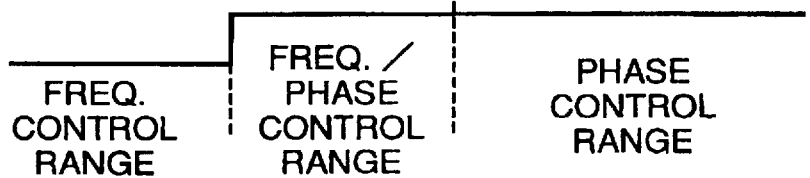
FREQ. ROUGH ADJUST "OK"
FREQ. CONTROL RANGE | FREQ./PHASE CONTROL RANGE | PHASE CONTROL RANGE
*Fig.8*
DYNAMIC RANGE OF FIRST D/A CONVERTER 13
(UPPER LIMIT) 127 ──────────────
(+SIDE 1/4) 63 ------------------
(CENTER) 0 ── ── ── ── ── ──
(−SIDE 1/4) −64 ------------------
(LOWER LIMIT) −128 ──────────────

DISK APPARATUS HAVING A DATA REPRODUCING SYSTEM USING A DIGITAL PLL

BACKGROUND OF THE INVENTION

1. Field of the Invention

The present invention generally relates to a disk apparatus, and in particular to a disk apparatus having a data reproducing system for reproducing information continuously recorded on a disk or recorded along a data recording guide groove having a periodically wobbling sector format formed on an optical disk, which the data reproduction apparatus rapidly adjusts a frequency of a reproduced tracking error signal in a frequency control system for rough adjustment, and subsequently, continuously generates clock signals locked to the reproduction signal in a phase control system for fine adjustment, even in a stage before a CLV control of a spindle motor is established.

2. Description of the Prior Art

Recently, there has been increasing utilization of various disks such as DVD-RAM disk having a sector format formed with a recording guide groove periodically wobbling. When information is read out of such a disk, the read-out data signal is supplied to a PLL circuit which generates a clock synchronized with the read-out signal to reproduce digital data synchronized with the clock signal.

The following explains a schematic structure of a sector format formed on a disk with reference to FIG. 17. In this sector format example, a guide track formed in a RAM portion on the disk includes a groove portion and a land portion. The guide track is formed in such a manner that a laser beam spot projected from an optical pick-up head tracks a specified position when information is recorded on the disk. The groove portions (depicted by real lines) and the land portions (depicted by dotted lines) are continuously alternated every one rotation of the disk where the information can be recorded both on the groove and land portions. The guide track is divided into a plurality of sectors and each of the sectors is comprised of an ID region and information recording region. In this example, although the guide track is formed of a spiral format, it may be of a concentric circle format, and also it may be reversible in spiral direction.

FIG. 15 shows an example of a conventional data reproducing apparatus using an analog PLL (Phase Locked Loop). In this construction, 101 denotes an optical disk, 102 denotes an optical pick-up device which applies laser beams to the optical disk and generates an electrical signal in accordance with the strength or quantity of the reflected light therefrom, 103 denotes a preamplifier for amplifying the read-out signal output of the optical pick-up device, 104 denotes a waveform equalizer for adjusting the frequency characteristics of the output signal of the preamplifier 103 and equalizing the waveform to be suited for binarizing, and 105 denotes a binarizing circuit for binarizing the output signal of the waveform equalizer 104, which the circuit blocks 104 and 105 constitute a waveform rectifier.

Reference numeral 110 denotes a PLL which is comprised of a phase comparator 106, loop filter 107 and a voltage control oscillator (referred to as "VCO" hereinafter) 108 for generating a PLL clock for synchronization. The phase comparator 106 compares the output signal of the binarizing circuit 105 with the output clock signal of the VCO 108 to thereby generate a phase error or difference in phase, and the loop filter 107 removes unnecessary frequency band i.e., high frequency components among from the output signal of the phase comparator 106, and VCO 108 generates a PLL clock having a frequency proportional to the output voltage of the loop filter 107. Reference numeral 109 denotes a latch circuit which latches the output reproduction signal of the binarizing circuit 105 and generates the reproduction read-out data in synchronization with the PLL clock outputted from the VCO 108.

The following explains the operation of the above conventional example of the analog PLL type. The readout information signal of the optical disk 101 by way of the optical pick-up device 2 is amplified by the preamplifier 103 and adjusted in frequency by the waveform equalizer 104 and the resultant signal is supplied to the binarizing circuit 105. In the binarizing circuit 105, the reproduction signal output of the waveform equalizer 104 is binarized, i.e., converted into "0" or "1" by a slice level process, and the binarized reproduction signal is supplied to the latch circuit 109 and also supplied to the PLL 110. The binarized reproduction signal has a waveform of two values 0 and 1 alternated at intervals each having a period integer times a given bit period T. Accordingly, the PLL 110 obtains a bit period T from the period of each value 0 or 1 and generates a clock signal having a period in accordance with the bit period T.

In the PLL 110, the binarized signal and the PLL clock outputted from the VCO 108 are compared in phase by the phase comparator 106 to perform a feedback control so as to make the phase error output equal zero. At this process, the VCO 108 adjusts its oscillation frequency by way of a voltage control so as to cancel the phase error, and generates a PLL clock having a frequency proportional to the output voltage of the loop filter 107, which the PLL clock is synchronized with the binarized signal. The synchronized clock signal is fed back to the phase comparator 106 and also supplied to the latch circuit 109. Then, the binarized reproduction signal supplied from the binarizing circuit 105 to the latch circuit 109 is generated as the digital reproduction data in synchronization with the PLL clock signal supplied from the VCO 108, so that the synchronized digital reproduction data is supplied to the later reproducing circuitry system.

In the conventional analog PLL type apparatus, however, there have been problems such that, the apparatus is easily influenced by undesirable environmental or aging changes and differences in parts, that high integration thereof can not be made, and that the apparatus can not cope with the case when taking account of incorporation of a circuit which requires synchronized multi-valued readout data.

Meanwhile, a conventional digital PLL has been developed using a variable frequency oscillator (referred to as "VFO" hereinafter) instead of a VCO, where an oscillation frequency is adjusted in accordance with the phase difference and is divided by a frequency divider, and the resultant obtained clock signal is fed back to the phase comparator. However, in this conventional digital PLL processing method, when a disk player having a high data processing speed is used, the frequency of the clock is high, and therefore it is difficult to attain a VFO for oscillating further several times higher frequency, and even when such a VFO is realized, the apparatus should be of high cost.

Therefore, another type of digital PLL is considered, incorporating a frequency comparator in combination with a phase comparator as shown in FIG. 16. In this construction shown in FIG. 16, an optical pick-up device 122 applies laser beams to an optical disk 121 and receives the reflection beams thereof from the optical disk. Thus the readout information signal is supplied to a preamplifier 123 as an electric reproduction signal in accordance with the quantity of the received reflection beams. The readout signal after amplified by the preamplifier 123 is supplied to an A/D converter 124 in which the readout signal is sampled in synchronization with the clock signal which is generated by the VCO 131 and then converted to a digital signal having a digital value of a given bit number (i.e., digitized). The digitized readout signal is rectified in waveform by a transversal filter 125 to be suitable for binarization. Thus, the resultant digital readout signal is supplied to the phase comparator 126 and also supplied to the digital reproducing system in the later stage.

Meanwhile, the frequency comparator 127 is supplied with both a reference clock REFCLK having a frequency corresponding to a central frequency of the reproduction signal and an output clock signal of the VCO 131 and calculates the frequency difference (error) therebetween. The calculated frequency error is supplied to a selector 128. When the frequency error is decreased to a given level or lower, the frequency comparator 127 transmits a switching signal to a timing control circuit 132.

On the other hand, the the phase comparator 126 detects the zero-cross point which is a turning point of the digital readout signal at which the value thereof is changed from positive (plus) to negative (minus) or changed from negative (minus) to positive (plus), and calculates the phase difference between two sampling values before and after the zero-cross point. Thus the calculated phase difference is supplied to the selector 128. The timing control circuit 132 receives the switching signal from the frequency comparator 127 and changes over the connecting terminals from a terminal Sb side to a terminal Sa side when the frequency difference is lower than a predetermined level. By this switching connection by the selector 128, a D/A converter 129 selectively receives the frequency difference data or the phase difference data and converts the selected difference data into an analog form. The analog signal is then supplied to a loop filter 130 to remove undesirable high frequency components contained therein, and the resultant analog signal is supplied to the VCO 131 which generates a PLL clock signal by reducing the error data to zero.

However, in this digital PLL type apparatus, in the case where the optical pick-up device is largely moved in a radial direction of the disk when a seeking or the like operation is caused, lock of the PLL is difficult in the stage before the CLV control of the spindle motor is established, which results in taking a long seeking time.

Moreover, when reproduction signal has different center frequency, the frequency control should be conducted with change of the reference clock. In this case, another frequency synthesizer is required to be incorporated, which results in high cost of the apparatus.

Also, in this construction, only one D/A converter is provided, and the D/A converter has a limited bit number. Therefore, in order to obtain a resolution accuracy higher than a constant level, the adjustment controllable range of the operation frequency is limited, and therefore, a sufficient resolution can not be obtained when a large range of operation frequency is to be covered in a range e.g., from one time to 32 times speed in reproduction.

SUMMARY OF THE INVENTION

The present invention has been developed to solve these problems and has an object to provide an improved disk apparatus, reducing a seeking time with a simple construction of a lower cost, having a sufficient resolution accuracy covering a large operation frequency range in a data reproducing system.

In order to achieve the object mentioned above, the present invention provides a disk apparatus having digital PLL circuit for generating a PLL clock signal in data reproducing system, in which readout information picked up from a disk is digitized by an A/D converter in synchronization with the PLL clock signal to thereby generate reproduction data in synchronization with the PLL clock signal, said PLL circuit comprising: a phase control loop for calculating a phase error from an output signal of the A/D converter to perform a phase control; and a frequency control loop for calculating a frequency error from the readout signal from the disk to perform frequency control, wherein the frequency control is performed when the frequency error is larger than predetermined level, and the phase control is performed when the frequency error is not more than the predetermined level, whereby the PLL clock signal is so generated as to eliminate the error data.

The phase control loop includes a phase comparator for calculating the phase error data from the output signal of the A/D converter to generate the phase error signal, a first loop filter receiving the output of said phase comparator to remove unnecessary frequency band components included in the phase error signal, and a first D/A converter for digital-to-analog converting the output signal of said first loop filter, and wherein said frequency control loop includes a frequency comparator for calculating the frequency error data between the readout signal from the disk and the PLL clock signal outputted from said PLL loop, a second loop filter receiving the output of said frequency comparator to remove unnecessary frequency band components included in the frequency error signal, and a second D/A converter for digital-to-analog converting the output signal of said second loop filter, whereby adjustment in frequency is rapidly controlled by the frequency control loop and the clock signal continually locked to the readout data is generated.

By this arrangement, according to the present invention, an offset voltage generated by an analog circuit located in the precedent stage can be canceled by applying an analog input signal to the A/D converter, and therefore the dynamic range of the A/D converter can be effectively used.

Moreover, since the second D/A converter having a rough frequency resolution and the first D/A converter having a fine frequency resolution are respectively used in combination for the frequency control and phase control in association with each other, therefore a wide operational frequency range in reproduction can be covered with high accuracy at a lower cost by incorporating the two D/A converters even using a digital PLL circuit.

Moreover, for the frequency control, used is a wobble binarized signal which can be sufficiently obtained merely when a tracking control is established, and the dynamic ranges of the first and second D/A converters are so controlled as to be subject to addition and subtraction at a time period having no problem for data reproduction, for example, at a time period corresponding to the guard region on which the reproduction signal is paused. By this arrangement, the frequency adjustment can be rapidly performed in the frequency control and the clock continuously locked to the data can be obtained by the phase control, thereby remarkably reducing the seek time.

BRIEF DESCRIPTION OF THE DRAWINGS

These and other objects and features of the present invention will be readily understood from the following detailed description taken in conjunction with preferred embodiments thereof with reference to the accompanying drawings, in which like parts are designated by like reference numerals and in which:

FIGS. 7A and 7B are timing charts for explaining an operation of a PLL of the present embodiment;

FIG. 8 is a line diagram for explaining an output dynamic range of the first D/A converter of the present embodiment;

DETAILED DESCRIPTION OF THE PREFERRED EMBODIMENTS

Figure 1:
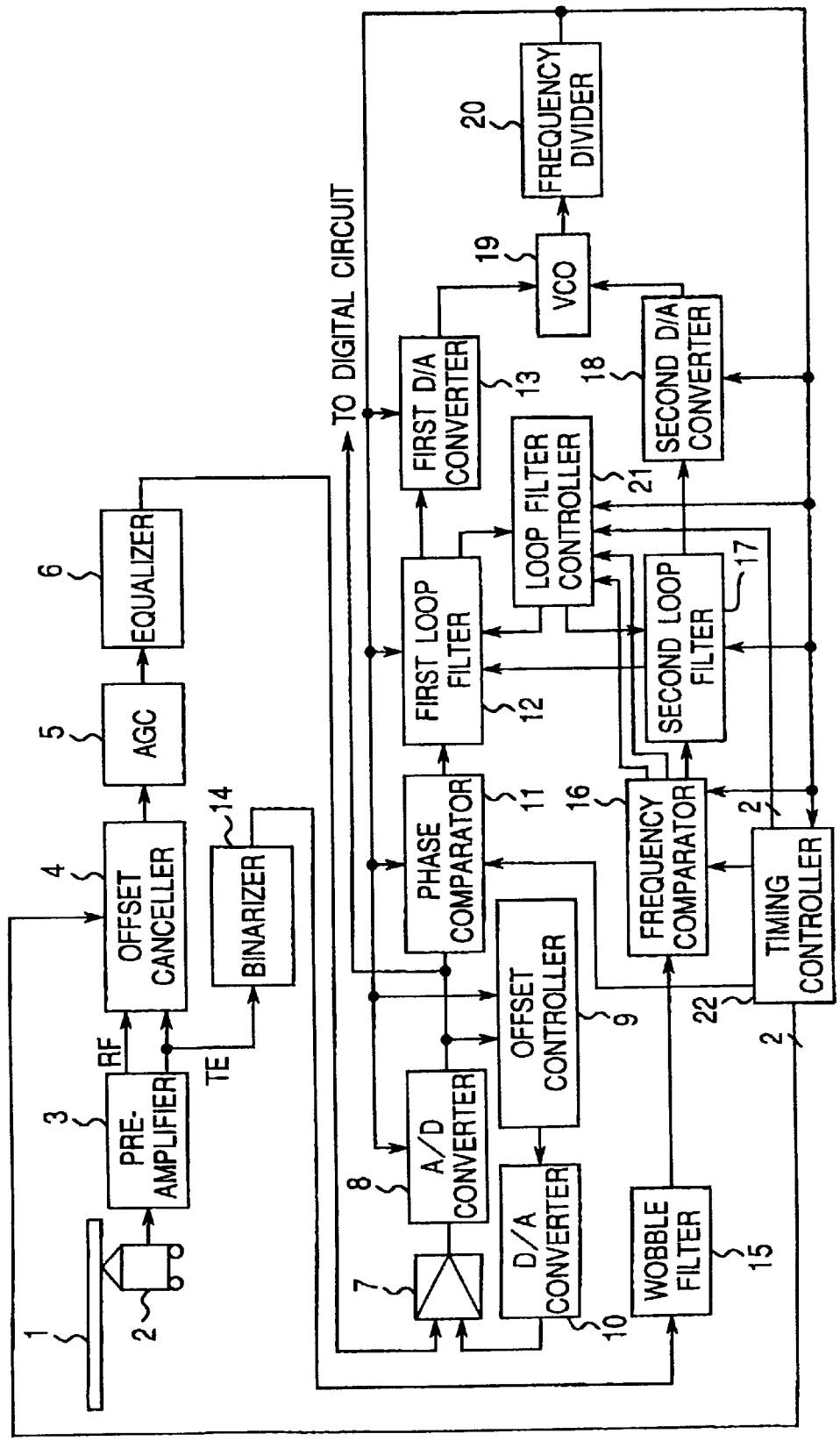
FIG. 1 is a block diagram of a data reproducing apparatus of an embodiment according to the present invention.

Before the description proceeds, it is to be noted that, since the basic structures of the preferred embodiments are in common to the conventional one, like parts are designated by the same reference numerals throughout the accompanying drawings.

A first preferred embodiment of a data reproducing apparatus for use in a disk player will be described below with reference to accompanying drawings. In the description, it is to be noted that, although the description is referred to only a data reproduction using an optical disk having a sector format including a periodically wobbling recording groove, the present invention is also applicable to data reproduction using such as CD disk, DVD-ROM disk and the like having continuously recorded data thereon.

FIG. 1 shows a block construction of a data reproducing system in an optical disk apparatus according to a first embodiment of the present invention. In this construction, reference numeral 1 denotes an optical disk having a sector format of a periodically wobbling recording groove, which is described in detail later with reference to FIG. 6. Reference numeral 2 denotes an optical pick-up device which applies laser beams to the optical disk and reads the recorded data based on the quantity of the reflected light beams and generates an electric signal therefrom. Reference numeral 3 denotes a preamplifier for amplifying the output signal of the pick-up device 2 and generates a tracking error signal (referred to as "TE signal" hereinafter) of a wide band and a RF signal.

Reference numeral 4 denotes an offset-canceling circuit for switching the RF signal and TE signals in time division supplied from the preamplifier 3 and clamping and offsetting the DC variation of the switched readout signal. Reference numeral 5 denotes an auto-gain controller (referred to as "AGC" hereinafter) for gain-controlling to have a constant amplitude of the output signal of the offset canceling circuit 4. Reference numeral 6 denotes an equalizer for adjusting a frequency characteristic of the output signal of the AGC 5.

Reference numeral 7 denotes a differential amplifier which subtracts the feedback voltage from the output signal of the equalizer 6. Reference numeral 8 denotes an A/D converter for converting the analog output signal of the differential amplifier 7 into a digital signal with use of a channel clock which is described later. Reference numeral 9 denotes an offset controller for extracting DC components of the A/D converter, and reference numeral 10 denotes a third D/A converter for offset feedback which converts the digital output signal of the offset controller 9 to an analog voltage signal. These block circuits 7 through 10 constitute an offset control loop. In this offset control loop, the DC component level of the analog signal to be inputted to the A/D converter 8 is adjusted to be substantially equal to a center point of a conversion level of the A/D converter 8. By this adjustment, the middle point in A/D conversion level is made equal to "0" after A/D conversion, and in the case of a voltage level lower than "0", the A/D converter outputs a negative value, and in the case of a voltage level higher than "0", the A/D converter outputs a positive value. Therefore, the sum of the positive component values is equal to the sum of the negative component values when taking a zero level as the center of the conversion level.

Reference numeral 11 denotes a phase comparator for producing a phase error signal from the digital output signal of the A/D converter 8 based on the channel clock. Reference numeral 12 denotes a first loop filter for removing an unnecessary high frequency component contained in the output signal of the phase comparator 11. Reference numeral 13 denotes a first D/A converter for converting the digital output signal of the first loop filter 12 to an analog signal. These block circuits 11, 12 and 13 construct a phase control loop for fine adjustment.

Reference numeral 14 denotes a wobble binarizing circuit which removes unnecessary frequency components included in the TE signal outputted from the preamplifier 3 and then extracts and binarizes the wobbling sine-wave signal having a period corresponding to a periodical wobbling recording groove formed on the disk. Reference numeral 15 denotes a wobble low-pass filter for removing chattering components included in the output signal of the wobble binarizing circuit 14. Reference numeral 16 denotes a frequency comparator which counts the period of the output signal of the wobble filter 15 based on the channel clock and compares the counted value with a given value to generate a frequency error signal. Reference numeral 17 denotes a second loop filter for removing unnecessary high frequency components included in the output signal of the frequency comparator 16. Reference numeral 18 denotes a second D/A converter for converting the digital output signal of the second loop filter 17 to an analog signal. These block circuits 16, 17 and 18 constitute a frequency control loop for rough adjustment.

Reference numeral 19 denotes a voltage control oscillator (VCO) which adds the output voltage of the first D/A converter 13 and the output voltage of the second D/A converter 18 to thereby generate a clock having a frequency corresponding to that of the added voltage. Reference numeral 20 denotes a frequency divider for dividing the output clock frequency of the VCO 19 into a desired frequency which is converted to a system operational frequency to thereby supply the channel clock to the entire parts of the system. Reference numeral 21 denotes a loop filter controller for supervising the output signal of the frequency comparator 16 based on a command transmitted from a timing controller 22 to thereby control the first and second loop filters 12 and 17. The timing controller 22 supplies a control signal to each part of the system in accordance with the recorded signal of the sector format formed on the optical disk 1.

The following describes part allotment of the phase control loop comprised of the circuit blocks 11, 12 and 13, and part allotment of the frequency control loop comprised of the circuit blocks 16, 17 and 18. Firstly, the frequency control loop is provided for the purpose of rapidly adjusting the frequency difference with a comparatively rough resolution while the phase control loop is provided for the purpose of comparing in phase and adjusting the phase difference with a fine resolution. This is because, each of the first and second D/A converters 13 and 18 has a limit in bit number, and therefore, in order for covering a large range of the operational frequency and a jitter-free reproduction range, both the second D/A converter 18 with rough resolution and the first D/A converter 13 with fine resolution are required to be controlled in accordance with the rotational speed of the optical disk in close association with each other. The frequency adjusting control is maintained until the frequency error is lowered within a capture range of the phase adjusting control, and then succeeded to the phase control.

It is noted here that the term "jitter-free reproduction" is referred to a following operation. That is, when a seeking like operation is caused in the CLV control, the reproduction frequency is largely varied due to a movement of the pick-up device in the radial direction of the optical disk until the CLV control is established. The jitter-free reproduction is referred to the operation of tracking the reproduction frequency of the optical disk and generating the clock in synchronization therewith using a PLL to thereby read out the data without any problem. In the present embodiment, the comparison rate in frequency resolution of the first D/A converter 13 vis-à-vis second D/A converter 18 is (1:30). In specific, the first D/A converter 13 is of 10 KHz/bit and the second D/A converter 18 is of 300 KHz/bit, and both of the converters are of an 8-bit input measure, the center frequency of the channel clock being 29.2 MHz, with the frequency divider 20 having a frequency dividing rate of ½. Thus, a change in frequency per one bit naturally results in a corresponding change in frequency of the output of the frequency divider 20.

Figure 2:
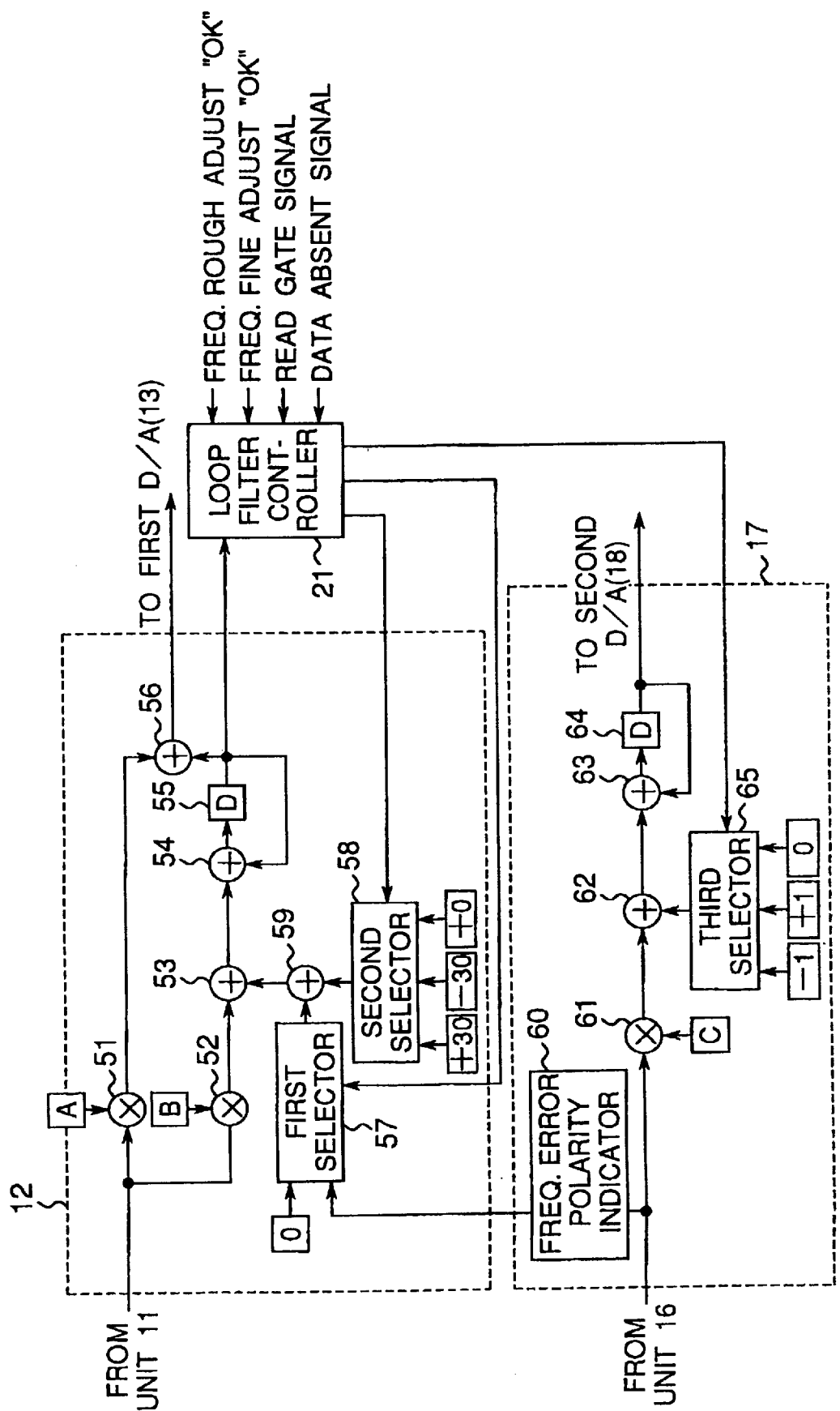
FIG. 2 is a block diagram showing a first and second loop filters of the present embodiment.

FIG. 2 shows a detail block construction of the first loop filter 12 and second loop filter 17 in association with the loop filter controller 21. In the first loop filter 12, reference numeral 51 denotes a first multiplier for multiplying the output signal of the phase comparator 11 by a first constant A, numeral 52 denotes a second multiplier for multiplying the output signal of the phase comparator 11 by a second constant B, numeral 53 denotes a first adder for adding the output signal of the second multiplier 52 and an output signal of a fourth adder 59 to be described later, numeral 54 denotes a second adder for adding the output signal of the first adder 53 and a delayed signal thereof delayed by one period of the channel clock, numeral 55 denotes a first delay circuit for delaying the output signal of the second adder 54 by one period of the channel clock, and numeral 56 denotes a third adder for adding the output signal of the first multiplier 51 and the output signal of the first delay circuit 55 and the resultant output signal is supplied to the first D/A converter 13.

Reference numeral 57 denotes a first selector for selecting between a polarity of the frequency error signal and "0" in accordance with an instruction from the loop filter controller 21, numeral 58 denotes a second selector for selecting a constant among from three values (+30, −30, +0, in this case) in accordance with an instruction from the loop filter controller 21, and numeral 59 denotes a fourth adder for adding the output signals of the first and second selectors 57 and 58.

In the second loop filter 17, reference numeral 60 denotes a frequency error polarity indicator for judging a polarity of the frequency error outputted from the frequency comparator 16 and selectively generating one of three values +1, −1 and 0. Numeral 61 denotes a third multiplier for multiplying the output signal of the frequency comparator 16 by a third constant C, numeral 62 denotes a fifth adder for adding the output signal of the third multiplier 61 and an output signal of a third selector 65 to be described later. Numeral 63 denotes a sixth adder for adding the output signal of the fifth adder 62 and the output signal of a second delay circuit 64 which is a delayed signal thereof delayed by one period of the channel clock, and numeral 65 denotes a third selector for selecting one of three values (+1, −1, 0, in this case) in accordance with an instruction from the loop filter controller 21. It is noted here that the first to third constants A, B and C are decided by tuning with frequency characteristics of the entire parts of the system.

Figure 3:
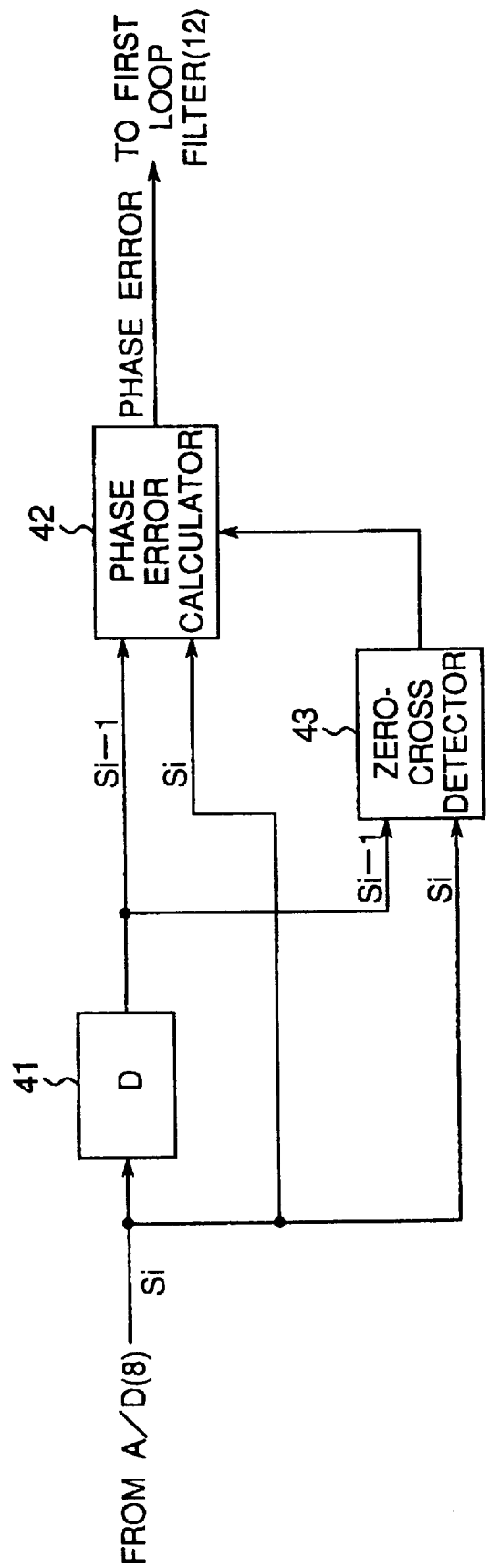
FIG. 3 is a block diagram showing a construction of a phase comparator of the present embodiment.

FIG. 3 shows an example of a construction of the phase comparator 11 where a delay unit 41 holds the digital output signal of the A/D converter 8 by one channel clock period and the delayed signal $S_{i-1}$ is supplied in common to a phase error calculator 42 and zero-cross detector unit 43 at a timing of the next channel clock. The zero-cross detector unit 43 judges from the reproduction output signal before and after the one channel clock period whether or not there occurs a zero-cross in the digital reproduction signal. Namely, when the values of the reproduction output signals $S_{i-1}$ and $S_1$ before and after the one channel clock period are respectively positive and negative, it is judged that a trailing (descent) zero-cross occurs, and when the values of the reproduction output signals $S_{i-1}$ and $S_i$ before and after the one channel clock period are respectively negative and positive, it is judged that a leading (rising) zero-cross occurs, and thereby instructing the phase error calculator unit 42 based on the judgment.

The phase error calculator unit 42 calculates the phase error from the reproduction output signals ($S_{i-1}$ and $S_i$) before and after the one channel clock period in accordance with the instruction supplied from the zero-cross detector unit 43, and the calculated phase error is supplied to the first loop filter 12. The calculation of the phase error is performed by, for example, taking a sum ($S_{i-1}+S_i$) of the both reproduction signals when the rising zero-cross is generated while taking the sum multiplied by −1, i.e., −($S_{i-1}$+$S_1$) when the trailing zero-cross is generated.

Figure 4:
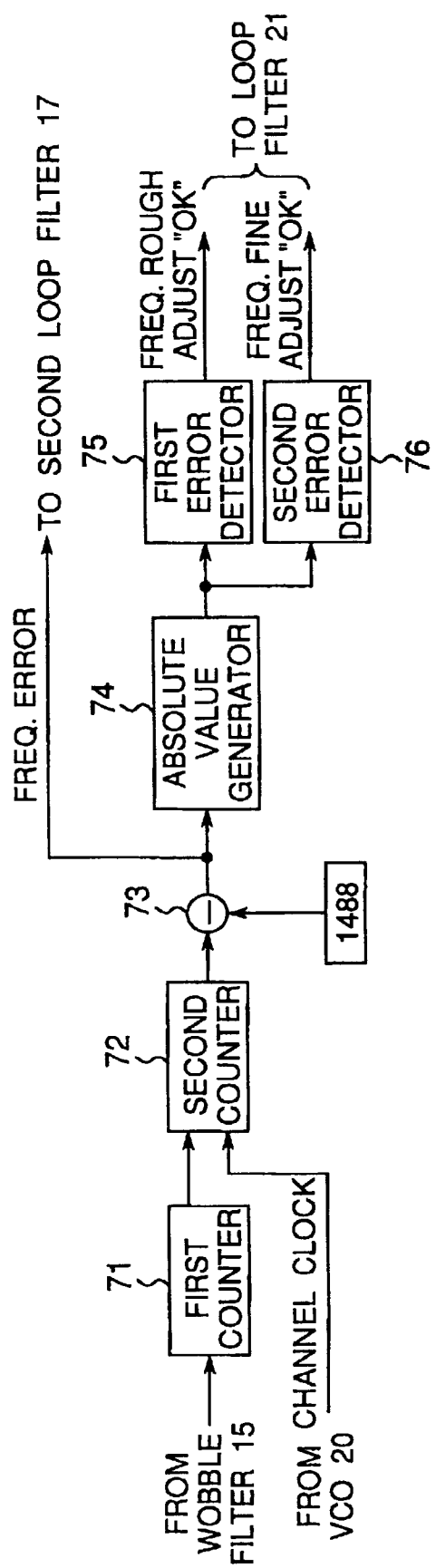
FIG. 4 is a block diagram showing a construction of a frequency comparator of the present embodiment.

FIG. 4 shows a detail construction of the frequency comparator 16, where reference numeral 71 denotes a first counter for counting a constant number at the timing of the rising edges of the binarized signal outputted from the wobble filter 15 and generating a periodical signal based on the period of the counted number of the constant. The periodical signal output of the first counter 71 is counted by a second counter 72 with the application of the channel clock. Numeral 73 denotes a subtractor subtracting the counted value output of the second counter 72 from a specified constant which is given as 1488 (=186×8) in this embodiment.

Numeral 74 denotes an absolute value generator for calculating an absolute value of the output of the subtractor 73. Numeral 75 denotes a first error detector for judging the value of the output of the absolute value generator 74. When the absolute value not more than a first predetermined value is continuously generated a specified number times, a frequency rough adjustment OK signal "1" is generated and when the absolute value more than the predetermined value is continuously generated the specified number times, a frequency rough adjustment NG signal "0" is generated by the first error detector 75. Similarly, numeral 76 denotes a second error detector for judging the value of the output of the absolute value generator 74. When the absolute value not more than a second predetermined value is continuously generated a specified number times, a frequency fine adjustment OK signal "1" is generated and when the absolute value more than the predetermined value is continuously generated the specified number times, a frequency fine adjustment NG signal "0" is generated by the second error detector 76.

Figure 5:
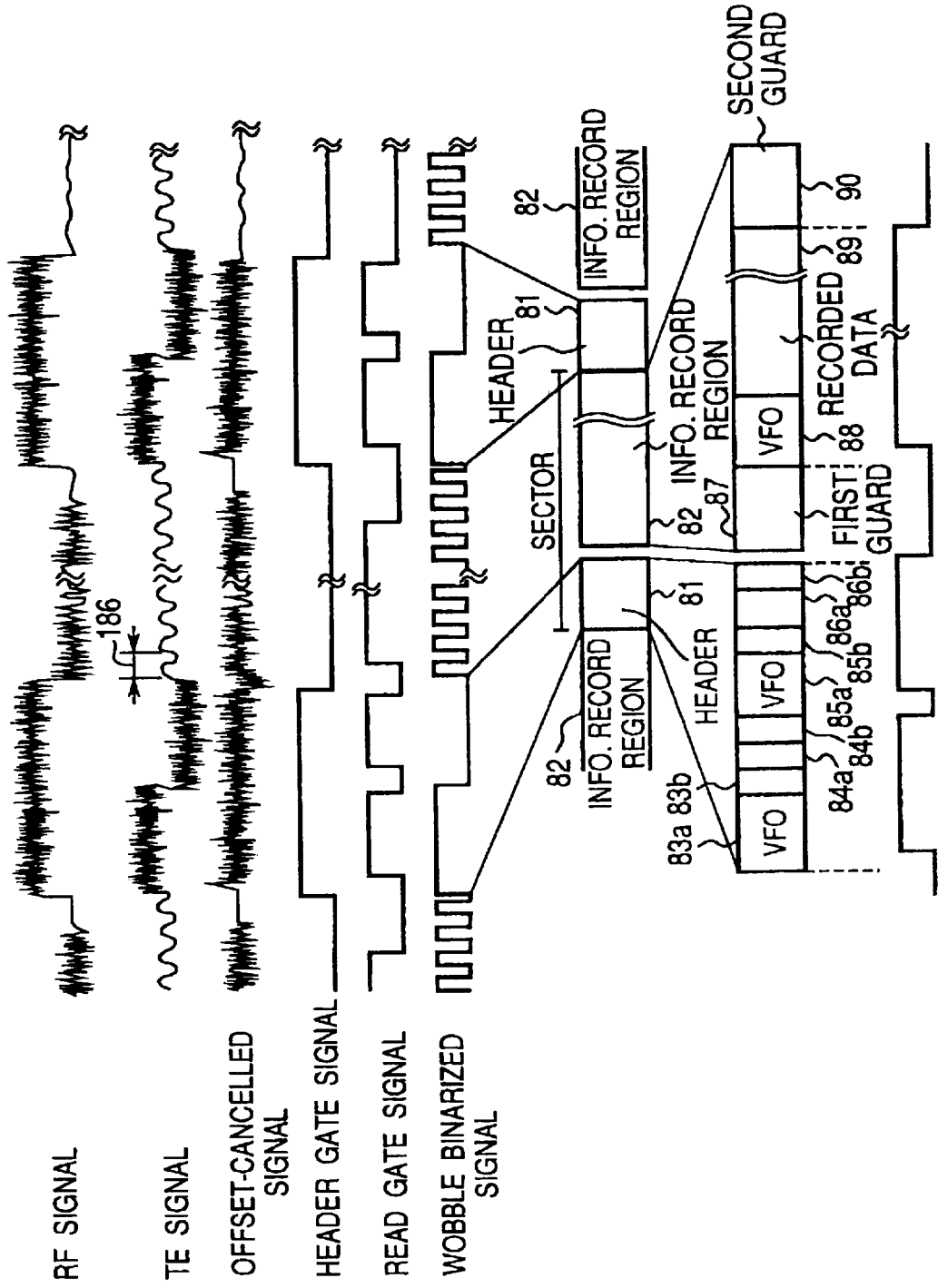
FIGS. 5A, 5B, 5C, 5D, 5E, 5F, 5G, 5H, and 5I are timing charts for explaining an operation of the present embodiment.

FIGS. 5A through 5I show timing charts in connection with the sector format of the recording guide groove formed on e.g. a DVD-RAM disk, where FIG. 5A shows the RF signal output of the preamplifier 3, FIG. 5B shows the TE signal output of the preamplifier 3, FIG. 5C shows the output of the offset canceler 4, FIG. 5D shows a header gate signal generated by the timing controller 22, FIG. 5E shows a read gate signal generated by the timing controller 22, FIG. 5F shows the wobble binarized signal, and FIGS. 5G to 5I show the disk sector format.

As shown in FIGS. 5G to 5I and FIG. 6, each sector is comprised of a header region 81 which is shifted by ½ track from the recording guide grove and an information recording region 82 having a periodically wobbling recording guide groove. The header region, which is formed of prepits, is mainly comprised of VFO portions 83a, 84a, 85a and 86a each having a sinngle frequency pattern and address ID portions 83b, 84b, 85b and 86b each having address information recorded. The information recording region 82 is a data rewritable region, and in the case where information is recorded therein, the construction thereof is mainly comprised of a first guard region 87, VFO portion 88, record data (i.e., user data) portion 89 and second guard region 90. The information recording region 82 has a periodically wobbling format having a period thereof being of 186 channel clock as shown in FIG. 5B. Therefore, irrespective of whether information is recorded or not in the information recording region 82, the TE signal shown in FIG. 5B includes a prepit signal corresponding to the header region 81 and a wobbling sine wave signal having a period of 186 channel clocks corresponding to the information recording region 82.

The detail construction of the DVD-RAM portion is explained with reference to FIG. 6. In this construction, the header region 81 is comprised of a pair of address information regions IDa and Idb which are shifted toward an inner or outer peripheral side by a distance of ½ track pitch, where IDa designates a region corresponding to the regions 83a, 83b, 84a and 84b shown in FIG. 5H, and IDb designates a region corresponding to the regions 85a, 85b, 86a and 86b shown in FIG. 5H. The width of the pit signal corresponding to the header region 81 is made generally equal to the width of a groove portion 33 or land portion 34 in the information recording region 82.

Figure 6:
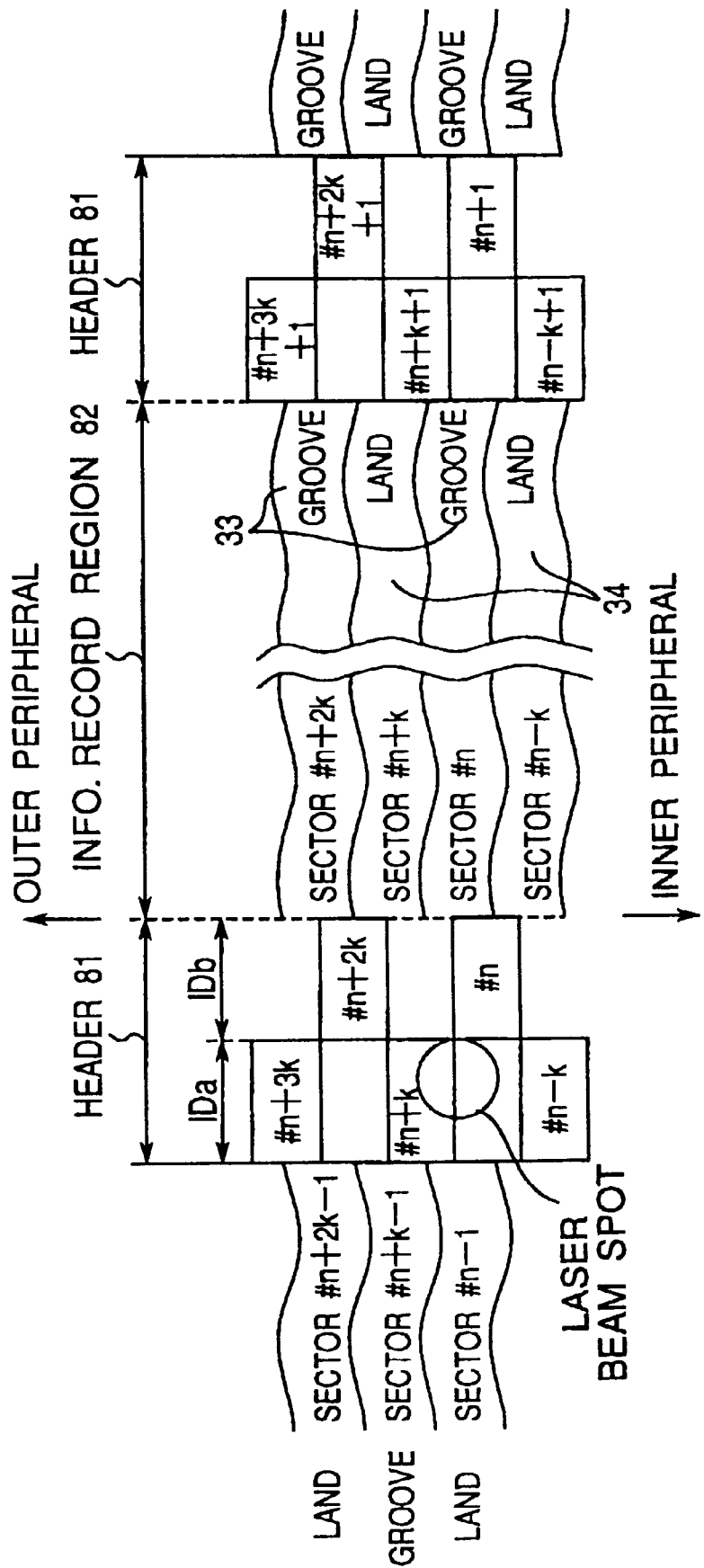
FIG. 6 is an explanatory view showing a schematic construction of a sector format of a DVD-RAM portion.

As shown in FIG. 6, the groove portion 33 and land portion 34 are periodically wobbling in sine wave format in a direction perpendicular to the tracing direction of the track. This sine wave wobble indicates that, when data is recorded on the information recording region 82 in the RAM portion by operating a disk drive, the period of the wobble is detected to generate a clock signal in synchronization with the detected period so that the data is recorded in synchronization with the clock signal. The wobble appears generally all around the groove poriton 33 and land portion 34, and therefore the PLL control can be rapidly conducted to thereby reduce a recording time.

FIGS. 7A and 7B show an operation of the frequency adjustment control conducted by the frequency control loop and the phase adjustment control conducted by the phase control loop in the PLL. In this operation, the output of the first error detector 75 and the output of the second error detector 76 shown in FIG. 4 are used in combination and the frequency adjustment and the phase adjustment are switched based on the error detection results, which the operation will be described later.

FIG. 8 shows a dynamic range output of the first D/A converter 13, and the following describes an operation of the disk apparatus of the present embodiment with reference to FIG. 1 to 8.

The readout signal picked up from the optical disk 1 by the pick-up device 2 is applied to the preamplifier 3 which generates the RF signal shown in FIG. 5A and TE signal shown in FIG. 5B, and the RF and TE signals are selectively applied to the offset canceler 4. The offset canceler 4 is also supplied with the header gate signal shown in FIG. 5D and the read gate signal shown in FIG. 5E from the timing controller 22 for controlling the PLL adjustment. The header gate signal is HIGH "1" only at a time corresponding to the header region 81, and meanwhile the read gate signal has rising edges at timings somewhat delayed from the heads of the VFO portions 83a and 85a and has trailing edges at timings corresponding to the ends of the address information portions 84b and 86b and also has a next rising edge at a timing somewhat delayed from the head of the VFO portion 88 and has a next trailing edge at a timing corresponding to an intermediate portion of the second guard region 90. When the header gate signal is HIGH "1", the TE signal is selected by the offset canceler 4 and when the header gate signal is LOW "0", the RF signal is selected by the offset canceler 4. When the read gate signal is LOW "0", the offset canceler 4 reduces a time constant of its internal clamping circuit to perform a rapid DC reproduction. By this operation, the offset canceler 4 generates the roughly DC offset canceled signal as shown in FIG. 5C.

Next, the following describes a method of offset-canceling the input signal of the A/D converter 8. First, the digitized signal output of the A/D converter 8 is applied to the offset controller 9 in which the MSB (i.e., nega-posi polarity signal) of the applied digital signal is counted at every nega-posi signs of the channel clock, and in the case of a positive sign, the counted value is added, and meanwhile in the case of a negative sign, the counted value is subtracted. The adding and subtracting processes are repeated and the integral data signal thereof is supplied to the third D/A converter 10 in the offset control loop. The digital integral value is converted to an analog voltage by the third D/A converter 10 and the resultant analog voltage is fed back to the differential amplifier 7. In the differential amplifier 7, the analog voltage value is subtracted from the output signal of the equalizer 6 and the resultant value is applied to the A/D converter 8. By this operation, the offset voltage generated by the analog circuit located in former stage can be canceled with the analog input signal of the A/D converter, and therefore the dynamic range of the A/D converter 8 can be effectively used.

Next, the following describes a jitter-free reproduction. When a tracking control is switched on upon detection of occurrence of a seeking or retry operation, the timing controller 22 transmits a start command to the frequency comparator 16 for starting the operation. Meanwhile, the TE signal shown in FIG. 5B is applied from the preamplifier 3 to the wobble binarizer 14 in which a sine wave having a frequency corresponding to 186 channel clocks is extracted by a band-pass filter (not shown) to thereby generate a wobble binarized signal shown in FIG. 5F. Then, chatterings included in the binarized signal output of the wobble binarizer 14 is removed by a wobble filter 15 to generate an improved signal with removal of a clock having a period more than a predetermined value.

When the wobble binarized signal is applied to the frequency comparator 16 from the wobble filter 15, the rising edge of the wobble binarized signal is counted eight times by the first counter 71 shown in FIG. 4 to generate a signal having a period corresponding to eight times the rising edge of the wobble binarized signal. The period of the output signal of the first counter 71 is counted by the second counter 72 with the channel clock. The period corresponding to eight times the rising edge of the wobble binarized signal is inherently 1488 (=186×8), and therefore the counted value output of the second counter 72 is subtracted from 1488 by the subtractor 73 to generate the resultant value as the frequency error signal at every period. In other words, when the resultant counted value is smaller than 1488 and the frequency is judged to be low, a positive value is generated as the frequency error signal so as to increase the frequency, and on the contrary, when the resultant counted value is greater than 1488 and the frequency is judged to be high, a negative value is generated as the frequency error signal so as to decrease the frequency.

Then, the absolute value generator 74 generates an absolute value of the frequency error signal. Next, in the first error detector 75, when the frequency error of not more than e.g. 32 is applied continuously four times from the absolute value generator 74, the frequency rough adjustment OK signal "1" is generated, and on the contrary, when the frequency error of greater than e.g. 32 is applied continuously four times from the absolute value generator 74, the frequency rough adjustment NG signal "0" is generated. In the second error detector 76, when the frequency error of not more than e.g. 4 is applied continuously four times from the absolute value generator 74, the frequency fine adjustment OK signal "1" is generated, and on the contrary, when the frequency error of greater than e.g. 4 is applied continuously four times from the absolute value generator 74, the frequency fine adjustment NG signal "0" is generated.

In the case where a frequency of the rotation of the spindle motor is largely changed due to occurrence of a seeking like operation in the tracking control stage before establishing the CLV control, firstly the frequency control is conducted in the frequency control range until the frequency rough adjustment OK signal "1" is generated as shown in FIG. 7B, and thereafter the frequency/phase control is succeeded and then the frequency fine adjustment OK signal "1" is generated. The frequency control range is referred to when the frequency rough and fine NG signals "0" are both generated, and the frequency/phase control range is referred to when the frequency rough adjustment OK signal is "1" and the frequency fine adjustment NG signal "0" is generated, and the phase control range is referred to when the frequency rough and fine OK signals are both "1".

In the frequency control range, when the frequency error output signal of the subtractor 73 is supplied to the second loop filter 17 shown in FIG. 2, the third multiplier 61 in the second loop filter 17 multiplies the frequency error signal by a constant C to generate the resultant multiplied value. Then, the third selector 65 selects "0" in the frequency control range and then the fifth adder 62 adds the output signal of the third multiplier 61 with the constant "0" selected by the third selector 65. Thereafter, the sixth adder 63 adds the output signal of the fifth adder 62 with the delayed output signal of the sixth adder 63 delayed by the second delay unit 64 so that the second delay unit 64 generates an improved signal removing unnecessary frequency components included in the frequency error signal.

The second D/A converter 18 converts the digital output signal of the second delay unit 64 to an analog voltage which is applied to the VCO 19. The clock generated by the VCO 19 is frequency-divided at a desired frequency-division rate (i.e., ½ in this embodiment) by the frequency divider 20 to generate the resultant frequency-divided clock as the channel clock. Thus, the obtained channel clock is applied to the A/D converter 8 to thereby perform the feedback control so as to generate the frequency error within the range of ±32/1488. In this frequency control range, the used numeric value ±32 is ±2.15% to 1488 and the frequency variable range of the first D/A converter 13 in the phase control loop is decided to be approximately ±10% of the center frequency defined by the second D/A converter 18 in the frequency control loop. That is, the first D/A converter 13 of 8-bit output with 10 KHz/bit has a frequency control range of 2.56 MHzp-p with respect to the center frequency 29.2 MHz. The numeric value ±32 (=±2.15%) is approximately ±20% times (x) approximately ±10% of this value, which indicates the range in which the phase control can be conducted by the phase control loop.

As the result of the frequency control, when the frequency rough adjustment OK signal "1" and the frequency fine adjustment NG signal "0" are generated, the control process advances to the frequency/phase control range. In this stage, the operation of the second loop filter 17 is quite the same as that in the frequency control range. In the frequency/phase control range, the first selector 57 shown in FIG. 2 selects the output signal of the frequency error polarity indicator 60 upon receipt of the command from the loop filter controller 21 and the second selector 58 selects the constant "0". The fourth adder 59 adds the output signal of the first selector 57 and the output signal of the second selector 58. As the phase error signal is not generated from the phase comparator 11 in the frequency/phase control range, the first adder 53 adds the output signal of the fourth adder 59 and the output signal "0" of the second multiplier 52, and then the second adder 54 adds the output signal of the first adder 53 and the delayed signal thereof delayed by the first delay unit 55. The third adder 56 adds the output signal of the first delay unit 55 and the output signal "0" of the first multiplier 51 and the resultant signal is applied to the first D/A converter 13 where the digital output signal of the third adder 56 is converted to the analog voltage by the first D/A converter 13.

Then, similarly to the frequency control range, the digital output signal of the second loop filter 17 is converted to the analog voltage by the second D/A converter 18 and the resultant analog voltage is applied to the VCO 19. The VCO 19 adds the output signal of the first D/A converter 13 and the output signal of the second D/A converter 18 to generate a clock signal having a frequency corresponding to the added voltage.

The clock generated by the VCO 19 is frequency-divided at a desired frequency-division rate (i.e., ½ in this embodiment) by the frequency divider 20 to generate the resultant frequency-divided clock as the channel clock. Thus, the obtained channel clock is applied to the A/D converter 8 to thereby perform the feedback control so as to generate the frequency error within the range of ±4/1488. In this frequency/phase control range, the used numeric value ±4 is ±0.27% to 1488, which indicates that the PLL control can be sufficiently performed within the range when the capture range in the phase control loop is assumed to be ±0.5%.

Next, the following describes the operation of the frequency error polarity indicator 60. The frequency error polarity indicator 60 judges the polarity of the frequency error signal output of the frequency comparator 16, and when the frequency error is a positive value, the indicator 60 generates "+1", and generates "−1" when the error is a negative value, and generates "0" when the error is zero. The frequency error signal corresponding to the plus or minus sign of the frequency error signal is transmitted from the second loop filter 17 to the first loop filter 12 to thereby actuate the phase control loop. The reason why the first loop filter 12 is actuated in the frequency/phase control range is that, when the frequency fine adjustment is performed, the first loop filter 12 is actuated in accordance with the frequency error, so that the frequency control with higher resolution can be effected and the frequency adjustment can be promoted.

As the result of the frequency/phase control, when the frequency rough and fine adjustment OK signals are both "1", the process advances to the phase control range. In this stage, the output signal of the second loop filter 17 applied to the second D/A converter 18 is fundamentally unchanged. When in the phase control range, the first selector 57 selects the constant "0" upon receipt of the command transmitted from the loop filter controller 21. The timing controller 22 supplies the read gate signal shown in FIG. 5E to the loop filter controller 21 which the read gate signal is generated in the case of the VFO portion, ID portion and data portion necessary for phase adjustment. Then the phase comparator i starts the generation of the phase error signal and the second selector 58 is controlled by the loop filter controller 21. the loop filter controller 21 receives the read gate signal from the timing controller 22 which is generated in the case of the VFO portion, ID portion and data portion necessary for phase adjustment, and then controls the second selector 58 and third selector 65 in accordance with the output signal of the first delay unit 55 based on the read gate signal only at a timing corresponding to the end portion of the information recording portion 82. At a timing of conducting no control, the constant "0" is selected all the time.

When the phase error signal is applied to the first loop filter 12, the first multiplier 51 multiplies the phase error signal by the constant A while the second multiplier 52 multiplies the phase error by the constant B. The first adder 53 adds the output signal of the second multiplier 52 and the constant "0" output of the fourth adder 59. The second adder 54 adds the output signal of the first adder 53 and the delayed signal of the output of the second adder 54 delayed by the first delay unit 55. The third adder 56 adds the output signal of the first multiplier 51 and the output signal of the first delay unit 55, and the resultant added signal is applied to the first D/A converter 13 to be converted to the analog voltage signal. The analog voltage output of the first D/A converter 13 and the analog voltage output of the second D/A converter 18 are both applied to the VCO 19, where the digital output signal of the second loop filter 17 is held at the time of ending of the frequency/phase control and is converted to analog voltage by means of the second D/A converter 18.

The analog signals output of the first and second D/A converters 13 and 18 are both applied to the VCO 19 and added together to thereby generate a clock having a frequency corresponding to the added voltage. The clock generated by the VCO 19 is frequency-divided by the frequency divider 20 at a desired frequency division rate to generate the channel clock. Thus, the channel clock is applied to the A/D converter 8 and the phase control is conducted so that the phase error is eliminated to be zero, thereby to generate the channel clock phase-locked to the readout data. The digital reproduction data synchronized with the channel clock is generated by the A/D converter 8 and supplied to the digital signal processing circuit (not shown) in the later stage. The reason why the two analog voltages output of the first and second D/A converters 13 and 18 are added together in the VCO 19 is in order to generate a clock having a frequency corresponding to one input voltage. If only one output voltage of the first and second D/A converters 13 and 18 is selected to be applied to the VCO 19, the clock of a desired frequency can not be obtained. That is, if only the output of the first D/A converter 13 is applied to the VCO 19, the frequency control can not be performed, and if only the output of the second D/A converter 18 is applied, the phase control can not be performed.

When the control process advances to the end poriton of the information recording region 82 corresponding to the second guard region 90, the loop filter controller 21 performs the following operation based on the read gate signal generated by the timing controller 22. The loop filter controller 21 judges whether or not the input signal supplied from the first delay unit 55 is shifted dislocated beyond the range of ±¼ (i.e., from −64 to +63 bits) from the center of the dynamic range of the first D/A converter 13 as shown in FIG. 8, and when shifted to the plus side, the loop filter controller 21 transmits a command to the third selector 65 to select "+1" so that the output of the second loop filter 17 applied to the second D/A converter 18 is raised in frequency by one step. At the same time, the loop filter controller 21 transmits a command to the second selector 58 to select the constant "−30" so that the input to the first D/A converter 13 is lowered in frequency by 30 stages. By these operations in total, the oscillation frequency of the VCO 19 is made equal before and after the series of controls.

On the other hand, when shifted to the minus side, the loop filter controller 21 transmits a command to the third selector 65 to select the constant "−1" so that the output of the second loop filter 17 applied to the second D/A converter 18 is lowered in frequency by one step. At the same time, the loop filter controller 21 transmits a command to the second selector 58 to select the constant "−30" so that the input to the first D/A converter 13 is raised in frequency by 30 stages. By these operations in total, the oscillation frequency of the VCO 19 is made equal before and after the series of controls.

In the case where the information recording region 82 has no data recorded in the phase control range, since there is no data to be compared in phase, the phase error can not be obtained. However, in the stage immediately after a seeking like operation, even when the process is advanced in the phase control range after completion of the frequency/phase control range, the rotation control of the spindle motor is not finished and the reproduction frequency is continuously varied. In the case where the information recording region 82 has data recorded, even when the rotational control of the spindle motor is not finished, the frequency pursuit is carried out by the phase control loop and the dynamic range of the first D/A converter is performed at the time of the end of the information recording region 82, and therefore the phase control range can be continuously maintained.

However, when the information recording region 82 has no data recorded, the phase error signal is not generated, and therefore the frequency pursuit is not carried out in the phase control loop, and the phase control range is returned back to the frequency/phase control range or frequency control range, and accordingly the phase control range can not be continuously maintained. Therefore, when the timing controller 22 transmits the fact that the information recording region 82 has no data recorded, the loop filter controller 21 transmits a command to the first selector 57 to select the output signal of the frequency error polarity indicator 60. By this control operation, the frequency pursuit can be performed in the phase control loop and the dynamic range f the first D/A converter is adjusted at the timing of the end portion of the information recording region 82, so that the phase control range can be continuously maintained.

Figure 9:
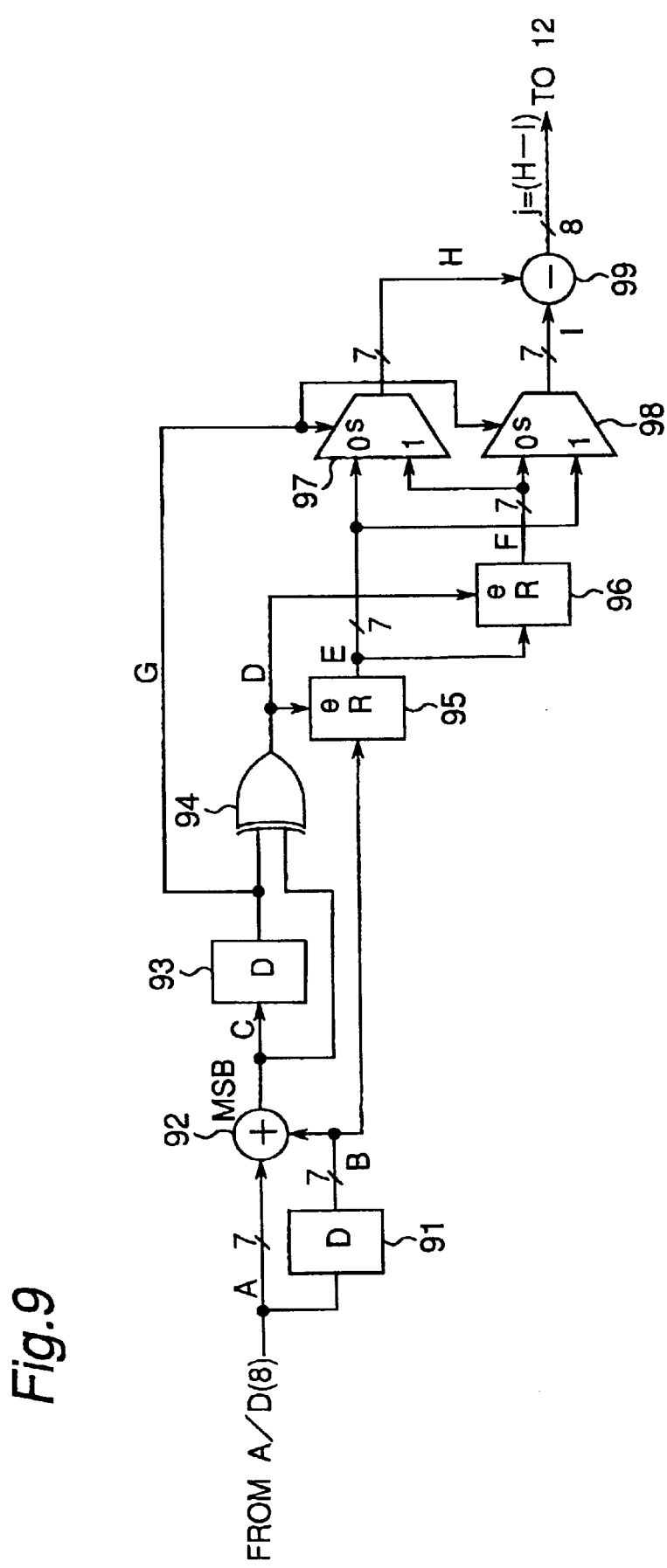
FIG. 9 is a block diagram showing a construction of a second example of a phase comparator of the present invention.
Figure 10:
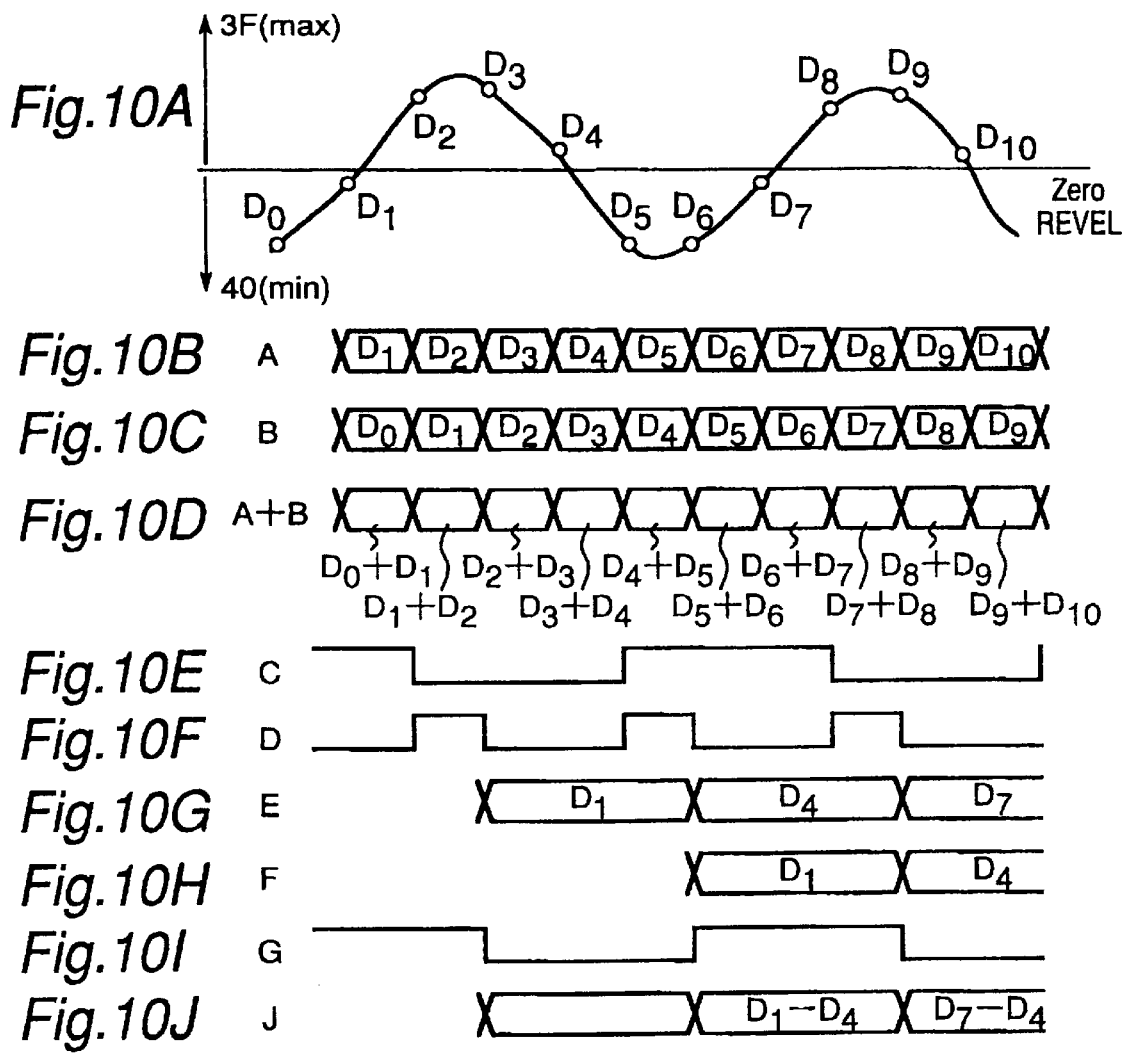
FIGS. 10A, 10B, 10C, 10D, 10E, 10F, 10G, 10H, 10I and 10J are timing charts explaining the second example of the phase comparator shown in FIG. 9.

Next, the following describes a construction and operation of a second example of the phase comparator 11 with reference to FIGS. 9 and 10, where FIG. 9 shows a block construction of the second example of the phase comparator 11 and FIG. 10A to 10J explain the operation thereof. FIGS. 10A to 10J denote signal waveforms at the points (A) to (J) shown in FIG. 9. In this construction, the first delay unit 91 holds the digital output signal (A) of the A/D converter 8 during a period of one channel clock and supplies the output signal (B) to both the adder 92 and the first register 95 with the next channel clock. The adder 92 adds the signals (A) and (B) to generate the most significant bit signal (C) of a sign bit. The second delay unit 93 holds the signal (C) in a period of one channel clock to generate a signal (G). An exclusive OR unit 94 generates a zero-cross signal (D) which is an exclusive OR of the signals (C) and (G). The first register 95 holds the output signal (B) of the first delay unit 91 during a period corresponding to a HIGH level "1" of the output signal (D) of the exclusive OR unit 94, and thereafter the held signal (B) is updated every time the signal (D) is HIGH "1", i.e., every time the zero-cross point appears.

The second register 96 holds the output signal (E) of the first register 95 during a period corresponding to the HIGH level "1" of the output signal (D) of the exclusive OR unit 94, and thereafter the held signal (E) is similarly updated every time the signal (D) is HIGH "1", i.e., every time the zero-cross point appears. The first selector 97 is controlled based on the output signal (G) of the second delay unit 93 thereby to select the output signal (E) of the first register 95 when the signal (G) is "0" level and select the output signal (F) of the second register 96 when the signal (G) is "1" level, and generates a signal (H).

The second selector 98 is controlled based on the output signal (G) of the second delay unit 93 to select the output signal (F) of the second register 96 when the signal (G) is "0" level and select the output signal (E) of the first register 95 when the signal (G) is "1" level thereby to generate a signal (I). The subtractor 99 subtracts the output signal (I) of the second selector 98 from the output signal (H) of the first selector 97 to obtain a phase error signal (J). That is, with reference to a zero-cross point precedent by one, when the phase is advanced, a negative value is generated, and when the phase is delayed, a positive value is generated.

Figure 11:
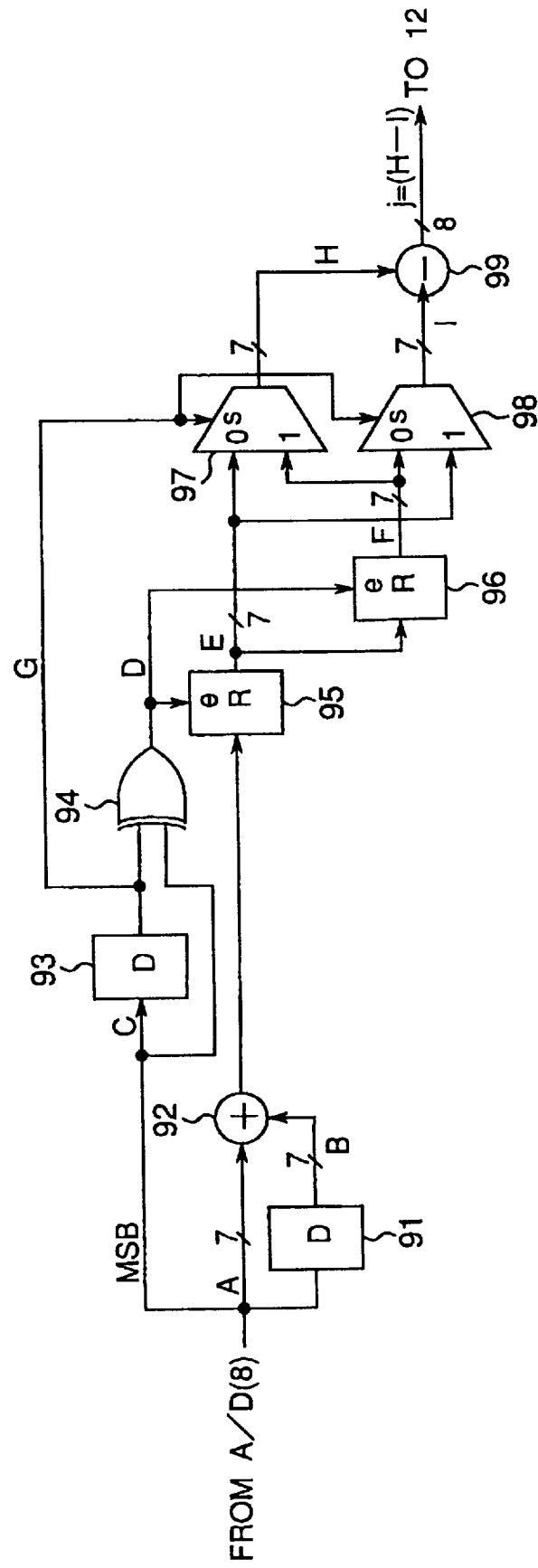
FIG. 11 is a block diagram showing a construction of a third example of a phase comparator of the present invention.
Figure 12:
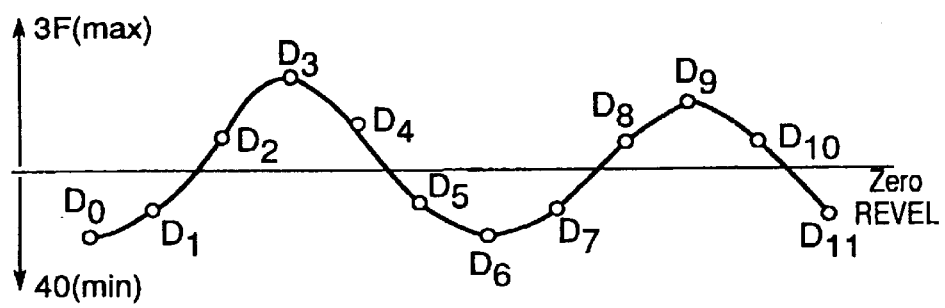
FIGS. 12A, 12B, 12C, 12D, 12E, 12F, 12G, 12H, 12I and 12J are timing charts explaining the third example of the phase comparator shown in FIG. 11.

FIG. 11 shows a construction of a third example of the phase comparator 11, and FIGS. 12A through 12J show the timing charts explaining the operation thereof. The different point of this example from the second example resides in that, the sign bit signal applied to the second delay unit 93 is the most significant bit of the digital output signal (A) of the A/D converter 8 and the input signal applied to the first register 95 is the output signal of the adder 92. The operation of the third example is similar to that of the second example, and as a result, the sampling point conducted by the A/D converter 8 is adjusted so that the PLL is locked at a timing shifted by 180 degrees in phase from that of the second example.

Figure 13:
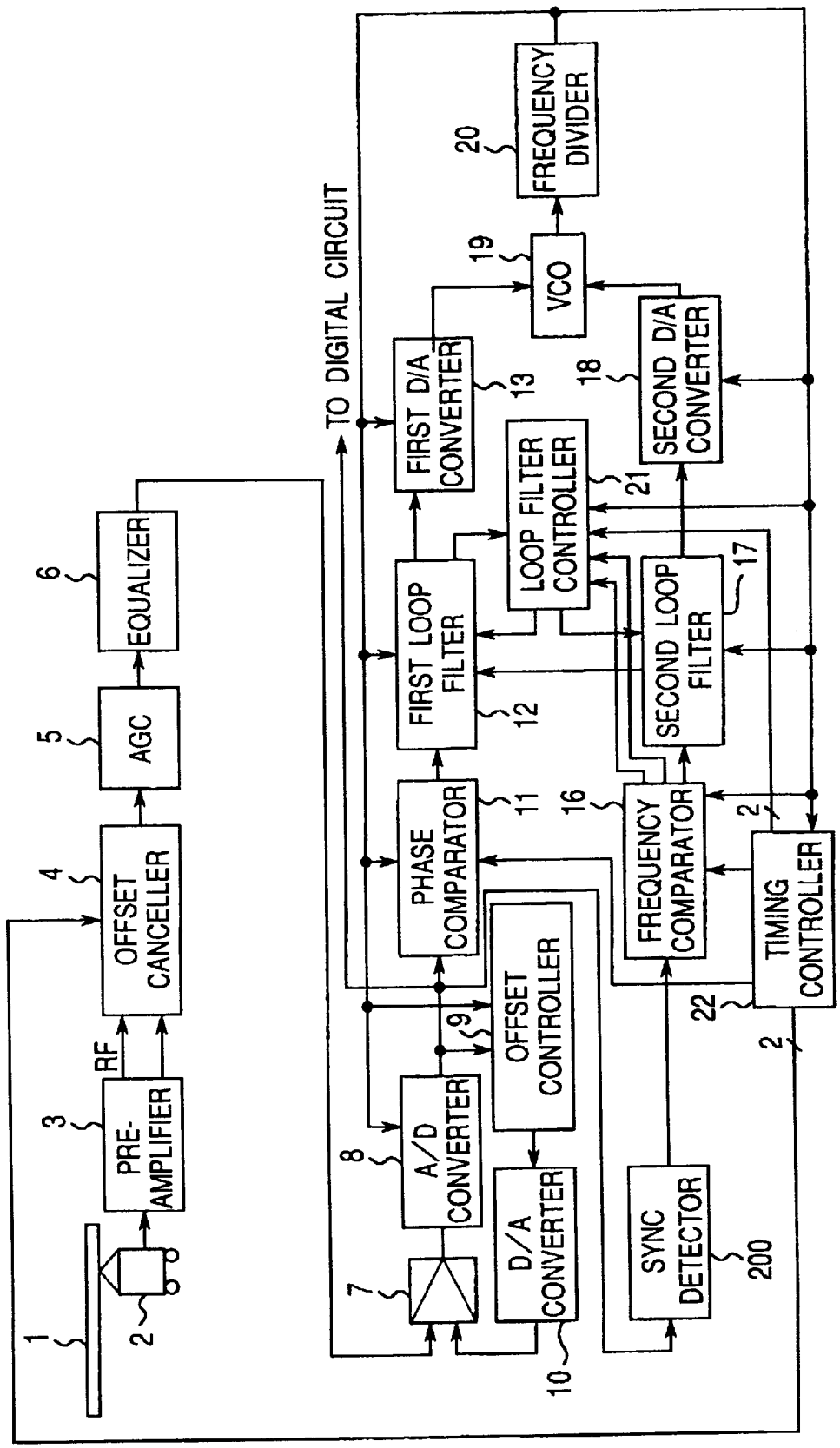
FIG. 13 is a block diagram of a data reproducing apparatus of a second embodiment according to the present invention.
Figure 14:
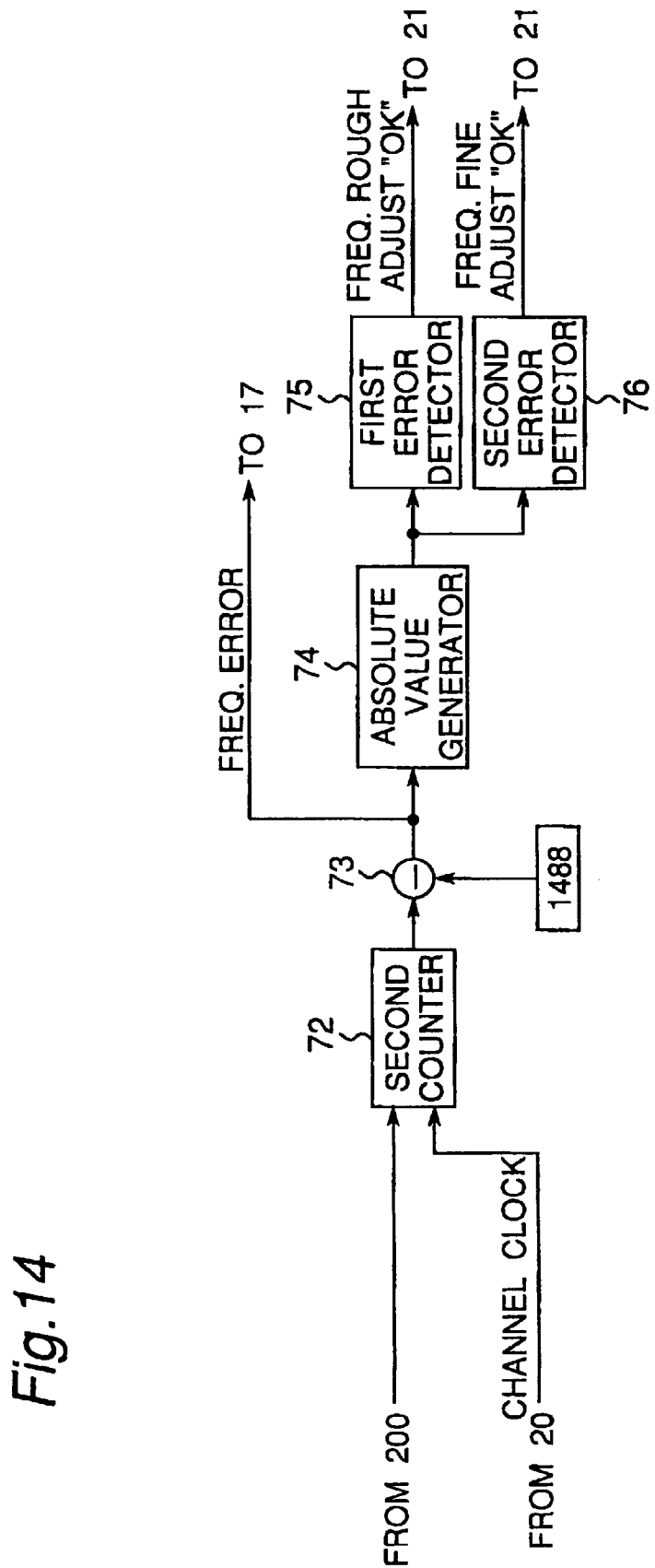
FIG. 14 is a block diagram showing a construction of a second example of a frequency comparator of the present invention.
Figure 15:
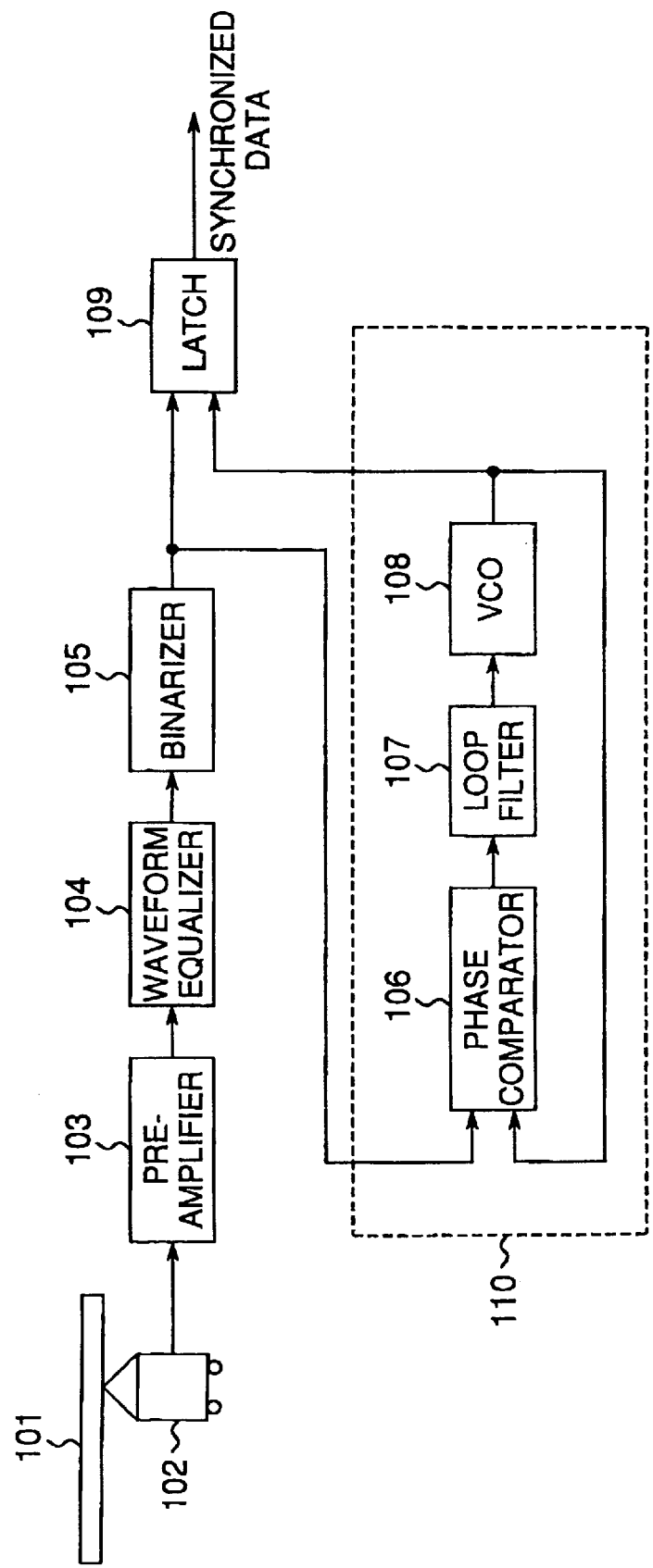
FIG. 15 is a block diagram showing a conventional data reproducing apparatus using an analog PLL.
Figure 16:
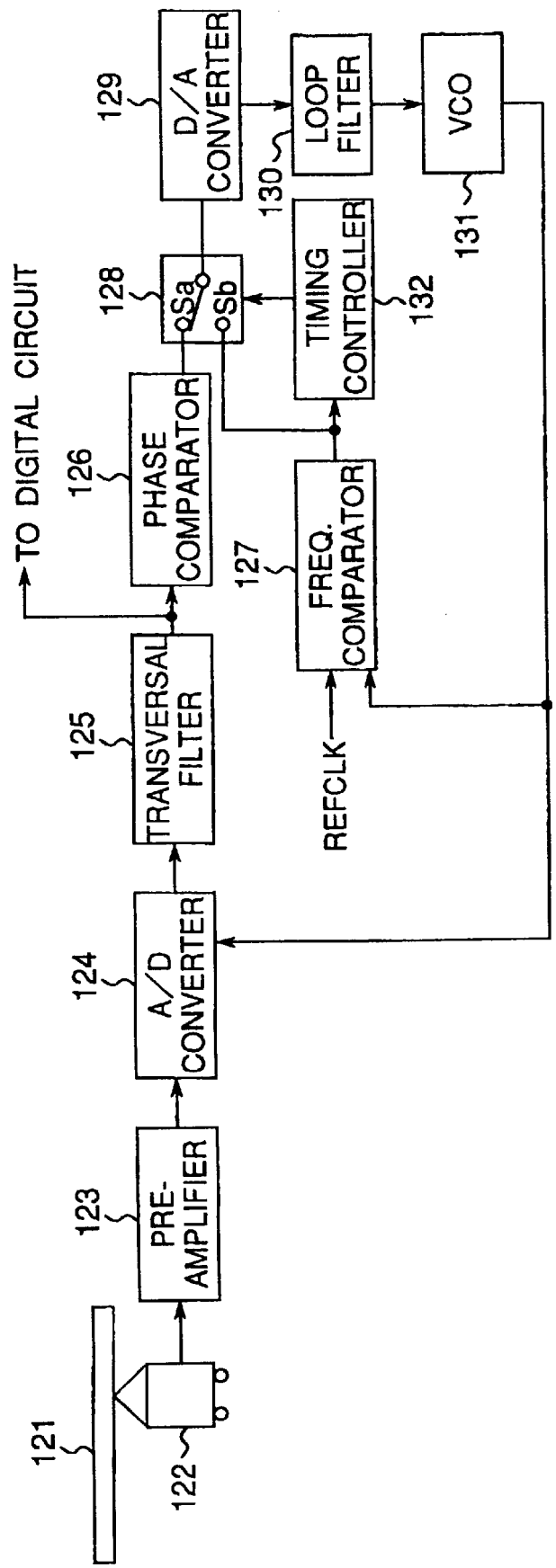
FIG. 16 is a block diagram showing an example of a data reproducing apparatus using a digital PLL.
Figure 17:
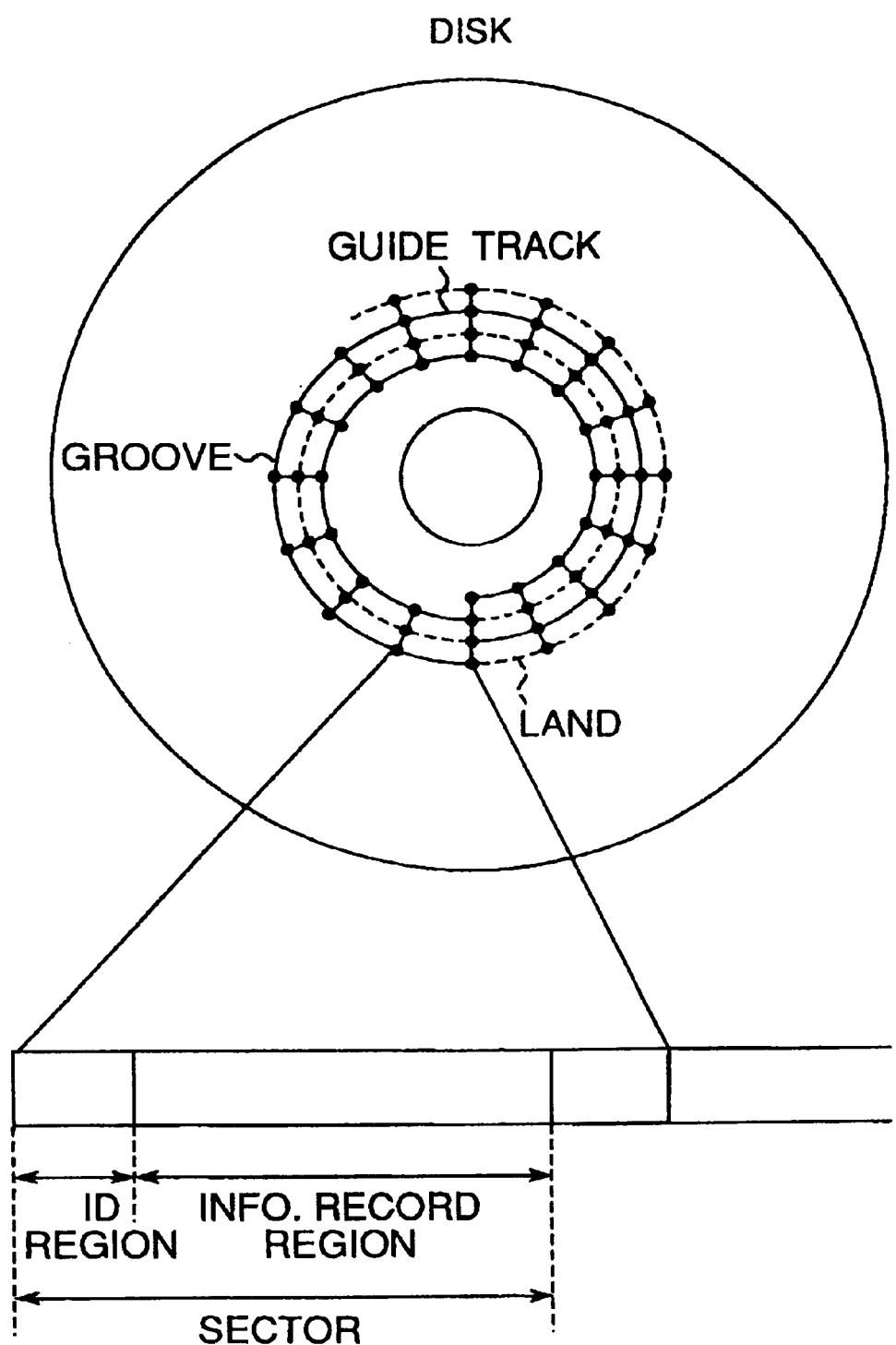
FIG. 17 is an explanatory view showing a schematic construction of a sector format of a disk.

FIG. 13 shows another example of the optical disk reproduction system and FIG. 14 shows a construction of another example of the frequency comparator 16 for use therein. These modified examples are adapted to reproduction of data recorded in such as a DVD-ROM disk having no periodical wobbling groove. The difference from those of the first embodiment shown in FIGS. 1 and 4 is that, the wobble binarizer 14 and wobble filter 15 are replaced by a SYNC detector 200 and that the first counter 71 is removed and the output of the SYNC detector 200 is directly applied to the second counter 72.

In this modified example, the SYNC detector 200 detects a SYNC signal from the digital output signal of the A/D converter 8 for demodulating the data and generates a pulse signal every time the SYNC signal is detected. The period of the pulse signal is counted by the channel clock and, for example, the period of the SYNC signal of the DVD-ROM disk corresponds to 1488 channel clocks and the other operation such as the frequency control is similar to that of the first embodiment.

It is noted here that, besides the period of the SYNC signal is counted, the frequency control may be conducted so that the minimum frequency or maximum frequency, alone or in combination, of the digital output signal of the A/D converter B has a desired count value. That is, the frequency error data may be calculated by the frequency comparator between any one of the minimum frequency or the maximum frequency signals included in the readout signal digitized by the A/D converter and the PLL clock signal outputted from the PLL loop. Alternatively, the frequency error may be calculated based on a combination of frequency error data between a minimum frequency signal of the digitized readout signal and the PLL clock signal outputted from said PLL loop with frequency error data between a maximum frequency signal of the digitized readout signal and the PLL clock signal outputted from said PLL loop to thereby generate a frequency error signal. Otherwise, a frequency error data may be calculated between a period of appearing a synchronization signal included in the readout signal digitized by said A/D converter and the PLL clock signal outputted from said PLL loop.

Moreover, in the modified example, the operation of the first and second loop filters in connection with the loop filter controller 21 is basically similar to that of the first embodiment. However, since DVD-ROM disk has no pause region between adjacent two sectors, the output signals of the first and second D/A converters 13 and 18 are subject to a low-pass filtering process, otherwise the output signal of the VCO 19 of the added value thereof is low-pass filtering processed so as not to unlock the PLL after the loop filtering control, and the jitter-free reproduction can be effected without any problem in continuous reproduction.

As described above, according to the present invention, an offset voltage generated by the analog circuit located in the precedent stage can be canceled by applying an analog input signal to the A/D converter, and therefore the dynamic range of the A/D converter can be effectively used.

Moreover, since the second D/A converter 18 having a rough frequency resolution and the first D/A converter 13 having a fine frequency resolution are respectively used in combination for the frequency control and phase control in association with each other, therefore a wide operational frequency range in reproduction can be covered with high accuracy at a lower cost by incorporating two D/A converters even using a PLL circuit.

Moreover, for the frequency control, used is a wobble binarized signal which can be sufficiently obtained merely when a tracking control is established, and the dynamic ranges of the first and second D/A converters 13 and 18 are so controlled as to be subject to addition and subtraction at a time having no problem for data reproduction, for example, at a timing corresponding to the guard region on which the reproduction signal is paused. By this arrangement, the frequency adjustment can be rapidly performed in the frequency control and a continuous locking of the clock to the data can be obtained by the phase control, thereby remarkably reducing the seek time.

It is noted that the constants used in the present embodiments such as frequency resolution of the D/A converter, frequency-division rate of the frequency divider, judgment numeric values of the frequency OK or NG used in the error detectors in the frequency comparator are merely examples and not limited.

Also, in the present embodiments, although a VCO is used as a PLL clock generating means, a current control oscillator can be used.

In the present embodiment, although the description is made with respect to the reproduction of the optical disk having a sector format having a recording guide groove periodically wobbling, the present invention can be also applicable to the reproduction of CD disk, DVD-ROM disk and the like.

Although the present invention has been described in connection with the preferred embodiments thereof with reference to the accompanying drawings, it is to be noted that various changes and modifications will be apparent to those skilled in the art. Such changes and modifications are to be understood as included within the scope of the present invention as defined by the appended claims, unless they depart therefrom.

What is claimed is:

1. A disk apparatus having a digital PLL circuit for generating a PLL clock signal in a data reproducing system, in which readout information picked up from a disk is digitized by an A/D converter in synchronization with the PLL clock signal to thereby generate reproduction data in synchronization with the PLL clock signal, said PLL circuit comprising:

a phrase control loop for calculating a phase error from an output signal of the A/D converter to perform a phase control; and a frequency control loop for calculating a frequency error from the readout signal from the disk to perform a frequency control, wherein the frequency control is performed when the frequency error is larger than a predetermined level, and the phase control is performed when the frequency error is not more than the predetermined level, whereby the PLL clock signal is so Generated as to eliminate the error data and, wherein said phase control loop includes a phase comparator for calculating the phase error data from the output signal of the A/D converter to generate the phase error signal, a first loop filter receiving the output of said phase comparator to remove unnecessary frequency band components included in the phase error signal, and a first D/A converter for digital-to-analog converting the output signal of said first loop filter, and wherein said frequency control loop includes a frequency comparator for calculating the frequency error data between the readout signal from the disk and the PLL clock signal outputted from said PLL loop, a second loop filter receiving the output of said frequency comparator to remove unnecessary frequency band components included in the frequency error signal, and a second D/A converter for digital-to-analog converting the output signal of said second loop filter, whereby adjustment in frequency is rapidly controlled by the frequency control loop and the clock signal continually locked to the readout data is generated.

2. A disk apparatus having a digital PLL circuit for generating a PLL clock signal in a data reproducing system, in which readout information picked up from a disk is digitized by an A/D converter in synchronization with the PLL clock signal to thereby generate reproduction data in synchronization with the PLL clock signal said PLL circuit comprising:

a phrase control loop for calculating a phase error from an output signal of the A/D converter to perform a phase control; and a frequency control loop for calculating a frequency error from the readout signal from the disk to perform a frequency control, wherein the frequency control is performed when the frequency error is larger than a predetermined level, and the phase control is performed when the frequency error is not more than the predetermined level, whereby the PLL clock signal is so generated as to eliminate the error data and, wherein said phase control loop includes a phase comparator for calculating a phase error from the output signal of the A/D converter to generate a phase error signal, a first loop filter for removing unnecessary frequency band components from the phase error signal, and a first D/A converter for digital-to-analog converting the output signal of said first loop filter, and wherein said frequency control loop includes a frequency comparator for calculating the frequency error data between any one of the minimum frequency and the maximum frequency signals included in the readout signal digitized by said A/D converter and the PLL clock signal outputted from said PLL loop, a second loop filter for removing unnecessary frequency band components from the frequency error signal, and a second D/A converter for digital-to-analog converting the output signal of said second loop filter, whereby adjustment in frequency is rapidly controlled by the frequency control loop and the clock signal continually locked to the readout signal is generated.

3. A disk apparatus having a digital PLL circuit for generating a PLL clock signal in a data reproducing system, in which readout information picked up from a disk is digitized by an A/D converter in synchronization with the PLL clock signal to thereby generate reproduction data in synchronization with the PLL clock signal, said PLL circuit comprising:

a phrase control loop for calculating a phase error from an output signal of the A/D converter to perform a phase control; and a frequency control loop for calculating a frequency error from the readout signal from the disk to perform a frequency control, wherein the frequency control is performed when the frequency error is larger than a predetermined level, and the phase control is performed when the frequency error is not more than the predetermined level whereby the PLL clock signal is so generated as to eliminate the error data and, wherein said phase control loop includes a phase comparator for calculating a phase error data from the output signal of the AID converter to generate a phase error signal, a first loop filter for removing unnecessary frequency band components from the phase error signal, and a first D/A converter for digital-to-analog converting the output signal of said first loop filter, and wherein said frequency control loop includes a frequency comparator for calculating the frequency error based on a combination of frequency error data between a minimum frequency signal of the digitized readout signal and the PLL clock signal outputted from said PLL loop with frequency error data between a maximum frequency signal of the digitized readout signal and the PLL clock signal outputted from said PLL loop to thereby generate a frequency error signal, a second loop filter for removing unnecessary frequency band components from the frequency error signal, and a second D/A converter for digital-to-analog converting the output signal of said second loop filter, whereby adjustment in frequency is rapidly controlled by the frequency control loop and the clock signal continually locked to the readout signal is generated.

4. A disk apparatus having a digital PLL circuit for generating a PLL clock signal in a data reproducing system, in which readout information picked up from a disk is digitized by an A/D converter in synchronization with the PLL clock signal to thereby generate reproduction data in synchronization with the PLL clock signal, said PLL circuit comprising:

a phrase control loop for calculating a phase error from an output signal of the A/D converter to perform a phase control; and a frequency control loop for calculating a frequency error from the readout signal from the disk to perform a frequency control, wherein the frequency control is performed when the frequency error is larger than a predetermined level, and the phase control is performed when the frequency error is not more than the predetermined level, whereby the PLL clock signal is so generated as to eliminate the error data and, wherein said phase control loop includes a phase comparator for calculating a phase error data from the output signal of the A/D converter to generate a phase error signal, a first loop filter for removing unnecessary frequency band components from the phase error signal, and a first D/A converter for digital-to-analog converting the output signal of said first loop filter, and wherein said frequency control loop includes a frequency comparator for calculating a frequency error data between a period of appearing a synchronization signal included in the readout signal digitized by said A/D converter and the PLL clock signal outputted from said PLL loop, a second loop filter for removing unnecessary frequency band components from the frequency error signal, and a second D/A converter for digital-to-analog converting the output signal of said second loop filter, whereby adjustment in frequency is rapidly controlled by the frequency control loop and the clock signal continually locked to the readout signal is generated.

5. The disk apparatus as claimed in claim 1, wherein said phase comparator extracts a zero-cross point of the digitized readout signal and calculates a phase error from sampling values at succeeding two zero-cross points.

6. The disk apparatus as claimed in claim 2, wherein said phase comparator extracts a zero-cross point of the digitized readout signal and calculates a phase error from sampling values at succeeding two zero-cross points.

7. The disk apparatus as claimed in claim 3, wherein said phase comparator extracts a zero-cross point of the digitized readout signal and calculates a phase error from sampling values at succeeding two zero-cross points.

8. The disk apparatus as claimed in claim 4, wherein said phase comparator extracts a zero-cross point of the digitized readout signal and calculates a phase error from sampling values at succeeding two zero-cross points.

9. The disk apparatus as claimed in claim 1, wherein said phase comparator specifies a zero-cross point of the digitized readout signal and calculates a phase error from two sampling values immediately before and after the specified zero-cross point.

10. The disk apparatus as claimed in claim 2, wherein said phase comparator specifies a zero-cross point of the digitized readout signal and calculates a phase error from two sampling values immediately before and after the specified zero-cross point.

11. The disk apparatus as claimed in claim 3, wherein said phase comparator specifies a zero-cross point of the digitized readout signal and calculates a phase error from two sampling values immediately before and after the specified zero-cross point.

12. The disk apparatus as claimed in claim 4, wherein said phase comparator specifies a zero-cross point of the digitized readout signal and calculates a phase error from two sampling values immediately before and after the specified zero-cross point.

13. The disk apparatus as claimed in claim 1, wherein said phase comparator specifies a zero-cross point of the digitized readout signal and adds two sampling values before and after the specified zero-cross point and calculates a phase error from the added sampling values at succeeding two zero-cross points.

14. The disk apparatus as claimed in claim 2, wherein said phase comparator specifies a zero-cross point of the digitized readout signal and adds two sampling values before and after the specified zero-cross point and calculates a phase error from the added sampling values at succeeding two zero-cross points.

15. The disk apparatus as claimed in claim 3, wherein said phase comparator specifies a zero-cross point of the digitized readout signal and adds two sampling values before and after the specified zero-cross point and calculates a phase error from the added sampling values at succeeding two zero-cross points.

16. The disk apparatus as claimed in claim 4, wherein said phase comparator specifies a zero-cross point of the digitized readout signal and adds two sampling values before and after the specified zero-cross point and calculates a phase error from the added sampling values at succeeding two zero-cross points.

17. The disk apparatus as claimed in claim 1, wherein said PLL circuit further comprises a clock generator for generating a clock signal of a frequency corresponding to that of the output signals of said first and second D/A converters, and a loop filter controller which controls the output signal of said first loop filter and when the output signal of said first loop filter exceeds a predetermined value, said loop filter controller adds a predetermined value to said second loop filter while subtracting a predetermined value from said first loop filter at the same time, and when the output signal of said first loop filter is smaller than the predetermined value, said loop filter controller subtracts a predetermined value from said second loop filter while adding a predetermined value to said first loop filter at the same time.

18. The disk apparatus as claimed in claim 2, wherein said PLL circuit further comprises a clock generator for generating a clock signal of a frequency corresponding to that of the output signals of said first and second D/A converters, and a loop filter controller which controls the output signal of said first loop filter and when the output signal of said first loop filter exceeds a predetermined value, said loop filter controller adds a predetermined value to said second loop filter while subtracting a predetermined value from said first loop filter at the same time, and when the output signal of said first loop filter is smaller than the predetermined value, said loop filter controller subtracts a predetermined value from said second loop filter while adding a predetermined value to said first loop filter at the same time.

19. The disk apparatus as claimed in claim 3, wherein said PLL circuit further comprises a clock generator for generating a clock signal of a frequency corresponding to that of the output signals of said first and second D/A converters, and a loop filter controller which controls the output signal of said first loop filter and when the output signal of said first loop filter exceeds a predetermined value, said loop filter controller adds a predetermined value to said second loop filter while subtracting a predetermined value from said first loop filter at the same time, and when the output signal of said first loop filter is smaller than the predetermined value, said loop filter controller subtracts a predetermined value from said second loop filter while adding a predetermined value to said first loop filter at the same time.

20. The disk apparatus as claimed in claim 4, wherein said PLL circuit further comprises a clock generator for generating a clock signal of a frequency corresponding to that of the output signals of said first and second D/A converters, and a loop filter controller which controls the output signal of said first loop filter and when the output signal of said first loop filter exceeds a predetermined value, said loop filter controller adds a predetermined value to said second loop filter while subtracting a predetermined value from said first loop filter at the same time, and when the output signal of said first loop filter is smaller than the predetermined value, said loop filter controller subtracts a predetermined value from said second loop filter while adding a predetermined value to said first loop filter at the same time.

21. A disk apparatus having a digital PLL circuit for generating a PLL clock signal in a data reproducing system, in which readout information picked up from a disk is digitized by an A/D converter in synchronization with the PLL clock signal to thereby generate reproduction data in synchronization with the PLL clock signal, said PLL circuit comprising:

a phrase control loop for calculating a phase error from an output signal of the A/D converter to perform a phase control; and a frequency control loop for calculating a frequency error from the readout signal from the disk to perform a frequency control, wherein the frequency control is performed when the frequency error is larger than a predetermined level, and the phase control is performed when the frequency error is not more than the predetermined level whereby the PLL clock signal is so generated as to eliminate the error data and, wherein said disk is formed with a recording guide groove having a periodically wobbling sector format, and said apparatus further comprises a preamplifier for detecting a signal corresponding to a period of said recording guide groove from the readout signal of said disk and a binarizer unit for binarizing the output signal of said preamplifier.

22. The disk apparatus as claimed in claim 18, wherein said loop filter controller controls the output signal of said first loop filter so that, when the adding and subtracting calculations are conducted on said first and second loop filters, the frequencies of the clock signal generated by said clock generator are substantially equal to each other before and after the adding and subtracting process.

23. The disk apparatus as claimed in claim 17, wherein said loop filter controller conducts the adding and subtracting process at a timing when reproduction of the recorded data from the disk is paused at a portion corresponding to a region having no necessary data recorded.

24. The disk apparatus as claimed in claim 17, wherein said loop filter controller conducts the adding and subtracting process on said first loop filter in accordance with the output signal of said frequency comparator at a portion corresponding to the data non-recorded region.

25. The disk apparatus as claimed in claim 5, wherein said disk is formed with a recording guide groove having a periodically wobbling sector format, and said apparatus further comprises a preamplifier for detecting a signal corresponding to a period of said recording guide groove from the readout signal of said disk and a binarizer unit for binarizing the output signal of said preamplifier.

26. The disk apparatus as claimed in claim 9, wherein said disk is formed with a recording guide groove having a periodically wobbling sector format, and said apparatus further comprises a preamplifier for detecting a signal corresponding to a period of said recording guide groove from the readout signal of said disk and a binarizer unit for binarizing the output signal of said preamplifier.

27. The disk apparatus as claimed in claim 13, wherein said disk is formed with a recording guide groove having a periodically wobbling sector format, and said apparatus further comprises a preamplifier for detecting a signal corresponding to a period of said recording guide groove from the readout signal of said disk and a binarizer unit for binarizing the output signal of said preamplifier.

28. The disk apparatus as claimed in claim 19, wherein said disk is formed with a recording guide groove having a periodically wobbling sector format, and said apparatus further comprises a preamplifier for detecting a signal corresponding to a period of said recording guide groove from the readout signal of said disk and a binarizer unit for binarizing the output signal of said preamplifier.

* * * * *